United States Patent
Floyd et al.

(10) Patent No.: US 8,308,962 B2
(45) Date of Patent: Nov. 13, 2012

(54) ETCHING PROCESSES USED IN MEMS PRODUCTION

(75) Inventors: Philip Floyd, Redwood City, CA (US); Chok Ho, Milpitas, CA (US); Teruo Sasagawa, Los Gatos, CA (US); Xiaoming Yan, Sunnyvale, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 957 days.

(21) Appl. No.: 12/210,010

(22) Filed: Sep. 12, 2008

(65) Prior Publication Data

US 2009/0071932 A1     Mar. 19, 2009

Related U.S. Application Data

(60) Provisional application No. 60/972,748, filed on Sep. 14, 2007.

(51) Int. Cl.
    *H01B 13/00* (2006.01)
(52) U.S. Cl. ............ 216/13; 216/63; 359/290; 359/292; 156/345.1; 156/345.27; 156/345.29
(58) Field of Classification Search .................... 216/13, 216/63; 359/290, 292; 156/345, 34.27
    See application file for complete search history.

(56) References Cited

U.S. PATENT DOCUMENTS

| | | |
|---|---|---|
| 2,534,846 A | 12/1950 | Ambrose et al. |
| 3,439,973 A | 4/1969 | Paul et al. |
| 3,443,854 A | 5/1969 | Weiss |
| 3,701,586 A | 10/1972 | Goetz |
| 3,955,190 A | 5/1976 | Teraishi |
| 4,190,488 A | 2/1980 | Winters |
| 4,213,818 A | 7/1980 | Lemons et al. |
| 4,407,695 A | 10/1983 | Deckman et al. |
| 4,425,572 A | 1/1984 | Takafuji et al. |
| 4,551,197 A | 11/1985 | Guilmette et al. |
| 4,617,608 A | 10/1986 | Blonder et al. |
| 4,790,634 A | 12/1988 | Miller et al. |
| 4,880,441 A | 11/1989 | Kesting et al. |
| 4,923,283 A | 5/1990 | Verhulst et al. |
| 5,114,226 A | 5/1992 | Goodwin et al. |
| 5,170,283 A | 12/1992 | O'Brien et al. |

(Continued)

FOREIGN PATENT DOCUMENTS

DE    10 2005 029803    1/2007

(Continued)

OTHER PUBLICATIONS

Biasotto et al., Silicon Oxide Sacrificial Layer for MEMS Applications, Microelectronics Technology and Devices Conference Proceedings (Electrochemical Society), pp. 389-397, 2005.

(Continued)

*Primary Examiner* — Nadine G Norton
*Assistant Examiner* — Maki Angadi
(74) *Attorney, Agent, or Firm* — Knobbe Martens Olson & Bear LLP

(57) ABSTRACT

The efficiency of an etching process may be increased in various ways, and the cost of an etching process may be decreased. Unused etchant may be isolated and recirculated during the etching process. Etching byproducts may be collected and removed from the etching system during the etching process. Components of the etchant may be isolated and used to general additional etchant. Either or both of the etchant or the layers being etched may also be optimized for a particular etching process.

15 Claims, 22 Drawing Sheets

U.S. PATENT DOCUMENTS

| | | | |
|---|---|---|---|
| 5,206,632 A | 4/1993 | Dupont et al. | |
| 5,259,923 A | 11/1993 | Hori et al. | |
| 5,337,191 A | 8/1994 | Austin | |
| 5,439,763 A | 8/1995 | Shimase et al. | |
| 5,454,904 A | 10/1995 | Ghezzo et al. | |
| 5,500,761 A | 3/1996 | Goossen et al. | |
| 5,795,208 A | 8/1998 | Hattori | |
| 5,824,374 A | 10/1998 | Bradley et al. | |
| 5,835,255 A | 11/1998 | Miles | |
| 5,844,711 A | 12/1998 | Long et al. | |
| 5,880,921 A | 3/1999 | Tham et al. | |
| 5,882,468 A | 3/1999 | Crockett et al. | |
| 5,914,804 A | 6/1999 | Goossen | |
| 5,949,571 A | 9/1999 | Goossen et al. | |
| 6,020,047 A | 2/2000 | Everhart | |
| 6,040,937 A | 3/2000 | Miles | |
| 6,046,659 A | 4/2000 | Loo et al. | |
| 6,094,285 A | 7/2000 | Wickham et al. | |
| 6,107,184 A | 8/2000 | Mandal et al. | |
| 6,115,172 A | 9/2000 | Jeong | |
| 6,142,358 A | 11/2000 | Cohn et al. | |
| 6,191,671 B1 | 2/2001 | Schlaak et al. | |
| 6,351,577 B1 | 2/2002 | Aksyuk et al. | |
| 6,384,952 B1 | 5/2002 | Clark et al. | |
| 6,535,318 B1 | 3/2003 | Wood et al. | |
| 6,650,455 B2 | 11/2003 | Miles | |
| 6,661,069 B1 | 12/2003 | Chinthakindi et al. | |
| 6,662,950 B1 | 12/2003 | Cleaver | |
| 6,674,562 B1 | 1/2004 | Miles | |
| 6,780,491 B1 | 8/2004 | Cathey et al. | |
| 6,808,953 B2 | 10/2004 | Partridge et al. | |
| 6,838,304 B2 | 1/2005 | Ikeda et al. | |
| 6,931,935 B2 | 8/2005 | Blomberg | |
| 6,943,448 B2 | 9/2005 | Gabriel et al. | |
| 6,947,195 B2 | 9/2005 | Ohtaka et al. | |
| 6,949,202 B1* | 9/2005 | Patel et al. | 216/58 |
| 6,967,986 B2 | 11/2005 | Kowarz et al. | |
| 7,012,726 B1 | 3/2006 | Miles | |
| 7,037,844 B2 | 5/2006 | Dache et al. | |
| 7,061,661 B2 | 6/2006 | Kowarz et al. | |
| 7,082,684 B2 | 8/2006 | Hantschel et al. | |
| 7,113,339 B2 | 9/2006 | Taguchi et al. | |
| 7,123,216 B1 | 10/2006 | Miles | |
| 7,140,102 B2 | 11/2006 | Taliashvili et al. | |
| 7,145,143 B2 | 12/2006 | Wood et al. | |
| 7,153,716 B2 | 12/2006 | Ikegami | |
| 7,190,245 B2 | 3/2007 | Receveur et al. | |
| 7,221,512 B2 | 5/2007 | Steenblik et al. | |
| 7,245,285 B2 | 7/2007 | Yeh et al. | |
| 7,252,861 B2 | 8/2007 | Smalley | |
| 7,327,510 B2 | 2/2008 | Cummings et al. | |
| 7,329,917 B2 | 2/2008 | Patraw et al. | |
| 7,399,710 B2 | 7/2008 | Launay | |
| 7,456,042 B2 | 11/2008 | Stark et al. | |
| 2002/0025595 A1 | 2/2002 | Xu et al. | |
| 2002/0033229 A1* | 3/2002 | Lebouitz et al. | 156/345 |
| 2002/0150130 A1 | 10/2002 | Coldren et al. | |
| 2002/0197761 A1 | 12/2002 | Patel et al. | |
| 2003/0012866 A1 | 1/2003 | Harnett et al. | |
| 2003/0123125 A1 | 7/2003 | Little | |
| 2003/0214639 A1 | 11/2003 | Patel et al. | |
| 2003/0218603 A1 | 11/2003 | Murayama et al. | |
| 2003/0232252 A1 | 12/2003 | Mancini et al. | |
| 2004/0012298 A1 | 1/2004 | Cunningham et al. | |
| 2004/0027225 A1 | 2/2004 | Lee et al. | |
| 2004/0029026 A1 | 2/2004 | Hayasaki et al. | |
| 2004/0226909 A1 | 11/2004 | Tzeng | |
| 2005/0045276 A1 | 3/2005 | Patel et al. | |
| 2005/0068627 A1 | 3/2005 | Nakamura et al. | |
| 2005/0124135 A1 | 6/2005 | Ayazi et al. | |
| 2005/0146401 A1 | 7/2005 | Tilmans et al. | |
| 2005/0184836 A1 | 8/2005 | Chou | |
| 2005/0206993 A1 | 9/2005 | Doan et al. | |
| 2005/0231787 A1 | 10/2005 | Tsuboi et al. | |
| 2006/0008200 A1 | 1/2006 | Nakamura et al. | |
| 2006/0016784 A1 | 1/2006 | Voss | |
| 2006/0067651 A1 | 3/2006 | Chui | |
| 2006/0077526 A1 | 4/2006 | Yun | |
| 2006/0077527 A1 | 4/2006 | Cummings | |
| 2006/0082863 A1 | 4/2006 | Piehl et al. | |
| 2006/0146396 A1 | 7/2006 | Lee et al. | |
| 2006/0146472 A1 | 7/2006 | Van Beek et al. | |
| 2006/0148262 A1 | 7/2006 | Lee et al. | |
| 2006/0170012 A1 | 8/2006 | Larmer et al. | |
| 2006/0183644 A1 | 8/2006 | Nakamura et al. | |
| 2007/0018761 A1 | 1/2007 | Yamanaka et al. | |
| 2007/0077525 A1 | 4/2007 | Davis et al. | |
| 2008/0035607 A1* | 2/2008 | O'Hara et al. | 216/63 |
| 2008/0157413 A1 | 7/2008 | Lin | |
| 2008/0158635 A1 | 7/2008 | Hagood et al. | |
| 2008/0158645 A1* | 7/2008 | Chiang | 359/290 |
| 2008/0165122 A1 | 7/2008 | Duthaler et al. | |
| 2008/0217645 A1 | 9/2008 | Saxler et al. | |
| 2008/0311690 A1 | 12/2008 | Tu et al. | |
| 2009/0218312 A1 | 9/2009 | Floyd et al. | |

FOREIGN PATENT DOCUMENTS

| | | |
|---|---|---|
| EP | 0 008 347 | 3/1980 |
| EP | 0 008 347 A1 | 3/1980 |
| EP | 1 190 759 | 3/2002 |
| EP | 1 190 759 A2 | 3/2002 |
| EP | 1 493 711 | 1/2005 |
| EP | 1 641 026 | 3/2006 |
| EP | 1 641 026 A2 | 3/2006 |
| JP | 61-187238 | 8/1986 |
| JP | 63-194285 | 8/1988 |
| JP | 2002-097007 | 7/1990 |
| JP | 5-196881 | 8/1993 |
| JP | 5-281479 | 10/1993 |
| JP | 09-33942 | 7/1997 |
| JP | 10-209176 | 8/1998 |
| JP | 11-160635 | 6/1999 |
| JP | 2000-28938 | 1/2000 |
| JP | 2000-031510 | 1/2000 |
| JP | 2000-90801 | 3/2000 |
| JP | 2007-83341 | 6/2001 |
| JP | 2001-272613 | 10/2001 |
| JP | 2002-350751 | 4/2002 |
| JP | 2003-136499 | 5/2003 |
| JP | 2003-315732 | 11/2003 |
| JP | 2004-334201 | 11/2004 |
| JP | 2005-077718 | 3/2005 |
| JP | 2007-150305 | 6/2007 |
| TW | 508458 | 11/2002 |
| WO | WO 98/10886 | 3/1998 |
| WO | WO 98/14804 | 4/1998 |
| WO | WO 00/23376 | 4/2000 |
| WO | WO 2004/041918 | 5/2004 |
| WO | WO 2005/057291 | 6/2005 |
| WO | WO 2006/110042 | 10/2006 |
| WO | WO 2006/110293 | 10/2006 |
| WO | WO 2007/022476 | 2/2007 |
| WO | WO 2008/046682 | 4/2008 |

OTHER PUBLICATIONS

Chui et al., "The iMOD display: considerations and challenges in fabricating MOEMS on large area glass substrates," Proceedings of SPIE, vol. 6466, Jan. 22, 2007.

Dowling et al., "Selective wet-etching of filtered-arc-deposited TiN films on Cr sacrificial layers," Proceedings of the SPIE—The International Society for Optical Engineering, vol. 5276, No. 1, pp. 213-220, 2004.

Fang et al., "Modeling the effect of etch holes on ferromagnetic MEMS," Magnetics, IEEE Transactions, vol. 37 Issue 4, Part 1, pp. 2637-2639, Jul. 2004.

Jerman J. H. et al., "Miniature Fabry-Perot Interferometers Micromachined in Silicon for Use in Optical Fiber WDM Systems," Transducers. San Francisco, Jun. 24-27, 1991, Proceedings of the Internatioal Conference on Solid State Sensors Andactuators, New Youk IEEE, US, vol. Conf. 6.

Ko et al. "Micromachined air-gap structure MEMS acoustic sensor using reproducible high-speed lateral etching and CMP process" Journal of Micromechanics and Microengineering, vol. 16, No. 10, p. 2071-2076, IOP Publishing, Oct. 2006.

Kogut et al., A finite element based elastic-plastic model for the contact of rough surfaces, Tribology Transactions, 46(3):383-390, 2003.

Livingston, Ian P. "Fabrication of an integrated surface microelectromechanical capacitive pressure sensor using an aluminum flexible diaphragm with on-chip electronics" Thesis (M.S.)—Rochester Institute of Technology, 1999. (Abstract).

Miles, A New Reflective FPD Technology Using Interferometric Modulation, Journal of the SID, 5/4 pp. 379-382, 1997.

Mark W. Miles, "MEMS-based interferometric modulator for display applications," Proceedings of SPIE, vol. 3876, Aug. 1999, pp. 20-28.

Mishima et al., High-performance CMOS circuits fabricated by excimer-laser-annealed poly-si TFT's on glass substrates, IEEE Electron Device Letters, 22:2(89-91) Feb. 2001.

H. Stahl et al. "Thin film encapsulation of acceleration sensors using polysilicon sacrificial layers" Jun. 2003 http://ieexplore.ieee.org/Xplore/login.jsp?url=/iel5/8626/27359/01217162.pdf.

Tabata et al., "In situ observation and analysis of wet etching process for micro electro-mechanical systems," Micro Electro Mechanical Systems, IEEE, pp. 99-102, Jan. 1991.

Yang et al. "Comparative study on chemical stability of dielectric oxide films under HF wet and vapor etching for radiofrequency microelectromechanical system application" Basic Res. Lab., Electron. & Telecommun. Res. Inst., Daejeon, South Korea, Thin Solid Films, vol. 500, No. 1-2, p. 231-236, Publisher: Elsevier Apr. 3, 2006.

Zhu et al., "Investigation of fabricating ultra deep and high aspect ratio electrical isolation trench without void," Solid-State and Integrated Circuits Technology, 2004. Proceedings. 7th International Conference, vol. 3 pp. 1892-1895, Oct. 2004.

Office Action dated Feb. 1, 2010 in U.S. Appl. No. 12/210,138.

Invitation to Pay Additional Fees including Annex to Form PCT/ISA206—Communication Relating to the Results of the Partial International Search issued on Feb. 25, 2009 in corresponding application PCT/US2008/076077.

Winters, H.F. et al. "The Etching of Silicon with XeF$_2$ Vapor." *Appl. Phys. Lett.* 34(1):70-73 (1979).

Office Action issued in corresponding U.S. Appl. No. 12/210,138 on Mar. 4, 2009.

International Search Report and Written Opinion dated Apr. 16, 2009, issued in related International Application No. PCT/US2008/076077.

IPRP for PCT/US08/076077, filed Sep. 11, 2009.

Londergan et al., 2007, Advanced processes for mems-based displays, Proceedings of the Asia Display 2007, SID, 1:107-112.

Petersen et al. 1978. Light-activated microcmechanical devices, IBM Technical Disclosure Bulletin, 21(3):1205-1206.

Winters, et al. The etching of silicon with XeF2 vapor. Applied Physics Letters, vol. 34, No. 1, pp. 70-73, (Jan. 1979).

Office Action dated Mar. 4, 2009 in U.S. Appl. No. 12/210,138.

Invitation to Pay Additional Fees for PCT/US08/076077, filed Sep. 11, 2009.

Kim et al., MEMS for Optical Functionality, Journal of Electroceramics, 2004, vol. 12, pp. 133-144.

Office Action dated Jul. 31, 2009 in U.S. Appl. No. 12/210,138.

Wagg et al., 1998, An apparatus for the direct measurement of fugacity in mixtures containing large and small molecules, Fluid Phase Equilibria, 150-151:807-813.

Office Action dated Feb. 22, 2012 in U.S. Appl. No. 12/210,026.

Office action dated Mar. 12, 2012 in U.S. Appl. No. 12/310,042.

Holmes, 2001, Laser fabrication and assembly processes for MEMS, MEMS SPIE, 4274:297-306.

Office action dated Oct. 19, 2011 in U.S. Appl. No. 12/310,042.

Office Action dated Sep. 7, 2011 in Chinese App. No. 200880106707.3.

Office Action dated Jun. 1, 2012 in Chinese App. No. 200880106707.3.

* cited by examiner

|  | Column Output Signals | |
|---|---|---|
|  | $+V_{bias}$ | $-V_{bias}$ |
| Row Output Signals   0 | Stable | Stable |
| $+\Delta V$ | Relax | Actuate |
| $-\Delta V$ | Actuate | Relax | ing a layer to be etched; a storage chamber operably attached to the etch chamber wherein the storage chamber is configured to store an etchant, and wherein the etchant comprises a noble gas fluoride; a separation component operably attached to the etch chamber, wherein the separation component is configured to isolate a noble gas-containing process gas.

ETCHING PROCESSES USED IN MEMS PRODUCTION

CROSS-REFERENCE TO RELATED APPLICATIONS

This application claims priority to U.S. Provisional Patent Application No. 60/972,748, filed Sep. 14, 2007, which is hereby incorporated by reference in its entirety.

BACKGROUND OF THE INVENTION

1. Field of the Invention

This invention relates to small scale electromechanical devices, such as microelectromechanical systems (MEMS) or nanoelectromechanical systems (NEMS) devices.

2. Description of the Related Art

MEMS include micro mechanical elements, actuators, and electronics. Although the term MEMS is used through the specification for convenience, it will be understood that the term is intended to encompass smaller-scale devices, such as NEMS. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

In one aspect, a method of fabricating an electronic device is provided, comprising providing an electronic device comprising a layer to be etched, the electronic device being located within an etch chamber; exposing the sacrificial layer to an etchant, the etchant comprising a noble gas fluoride; collecting at least a portion of the gases from the etch chamber; and processing the collected gases so as to separate the noble gas fluoride from the collected gases.

In another aspect, a method of fabricating an electronic device is provided, comprising providing an electronic device comprising a layer to be etched, the electronic device being located within an etch chamber; exposing the sacrificial layer to an etchant, the etchant comprising a noble gas fluoride; collecting at least a portion of the gases from the etch chamber; and processing the collected gases so as to separate a noble gas.

In another aspect, an etching device for use in fabricating an electronic device is provided, the etching device comprising: an etch chamber for retaining an electronic device comprising a layer to be etched; a storage chamber operably attached to the etch chamber wherein the storage chamber is configured to store an etchant, and wherein the etchant comprises a noble gas fluoride; a separation component operably attached to the etch chamber, wherein the separation component is configured to isolate a noble gas-containing process gas.

In another aspect, a method of manufacturing an electronic device is provided, comprising providing a process chamber comprising an electronic device, the electronic device comprising a layer to be etched; introducing an etchant into an expansion chamber, the etchant comprising a noble gas fluoride; reducing the volume of the expansion chamber to increase the pressure of the etchant; and introducing the pressurized etchant into the process chamber, exposing the sacrificial layer to the etchant.

In another aspect, a method of manufacturing an electronic device is provided, comprising providing a process chamber containing an electronic device, the electronic device comprising a layer to be etched; introducing an etchant into the process chamber, the etchant comprising a noble gas fluoride; and reducing the volume of the process chamber after introduction of the etchant to increase the partial pressure of the etchant.

In another embodiment, an etching device for use in fabricating an electronic device is provided, the etching device comprising: a storage chamber configured to store an etchant, wherein the etchant comprises a noble gas fluoride; and a process chamber configured to receive an electronic device to be etched, wherein the process chamber is in fluid communication with the storage chamber, and wherein the process chamber has a variable volume.

In another embodiment, an etching device for use in fabricating an electronic device is provided, the etching device comprising: a storage chamber configured to store an etchant, wherein the etchant comprises a noble gas fluoride; an expansion chamber in fluid communication with the storage chamber, the expansion chamber having a variable volume; and a process chamber configured to receive an electronic device to be etched, wherein the process chamber is in fluid communication with the expansion chamber.

In another embodiment, a method of manufacturing an electronic device is provided, comprising providing a process chamber containing an electronic device, the electronic device comprising a layer to be etched; introducing an etchant into the process chamber, the etchant comprising a noble gas fluoride; monitoring the partial pressure of the etchant in the process chamber; and introducing additional etchant into the process chamber based at least in part on the monitored partial pressure of the etchant in the process chamber.

In another embodiment, an etching device for use in fabricating an electronic device is provided, the etching device comprising a storage chamber configured to store an etchant, wherein the etchant comprises a noble gas fluoride; an etch chamber for retaining an electronic device during an etching process, wherein the etch chamber is in fluid communication with the storage chamber; a first sensor configured to determine the partial pressure of the etchant within the etch chamber; and a valve disposed along a fluid path between the storage chamber and the etch chamber and operably connected to the first sensor, the valve configured to control the rate of flow of etchant between the storage chamber and the etch chamber based at least in part upon the determined partial pressure of the etchant within the storage chamber.

In another aspect, a method of fabricating an electronic device comprising a sacrificial material is provided, wherein the method comprises providing an electronic device comprising a sacrificial material, the sacrificial material comprising a compound of the general formula $M_pX_q$, wherein M is selected from Mo, W, Si, and Ge; X is selected from Cl, F, O, N, and Si, wherein M is different from X, wherein p and q are in the range of 1 to 6, and wherein a molar volume of $M_pX_q$ for a given M is greater than a molar volume of M; and exposing the electronic device to an etchant.

In another aspect, a partially fabricated electronic device is provided, comprising a sacrificial material, the sacrificial material comprising a compound of the general formula $M_pX_q$, wherein M is selected from Mo, W, Si, and Ge; X is selected from Cl, F, O, N, and Si, wherein M is different from X, wherein p and q are in the range of 1 to 6, and wherein a molar volume of $M_pX_q$ for a given M is greater than a molar volume of M In another aspect, an etching device for use in fabricating a MEMS device is provided, the etching device comprising a storage system configured to store an etchant, wherein the etchant comprises $XeF_2$ and $O_2$; an etching chamber configured to retain a MEMS device during an etching process, wherein the etching chamber is in fluid communication with the storage system; and a cold trap in fluid communication with the etching chamber, wherein the cold trap is configured to remove a byproduct of the etching process.

In another aspect, a method of fabricating an electronic device is provided, comprising providing an unreleased electronic device within an etch chamber, wherein the unreleased electronic device comprises a sacrificial layer; and one or more light-transmissive layers adjacent a first side of the sacrificial layer; performing an initial etch through a portion of the sacrificial layer; releasing a gaseous etchant precursor into the etch chamber; and physically exciting the gaseous etchant precursor so as to form a chemically active species capable of etching a remaining portion of the sacrificial layer.

In another aspect, a method of fabricating an electronic device is provided, comprising: providing a partially fabricated electronic device within a process chamber, the partially fabricated electronic device comprising an exposed portion of a layer to be etched; introducing an gaseous etchant into the process chamber, wherein the etchant can be activated by exposure to ultraviolet radiation; and exposing a portion of the layer to be etched to radiation from an ultraviolet laser, wherein exposure to the ultraviolet laser activates the gaseous etchant.

In another aspect, a method of fabricating an electronic device is provided, comprising providing an electronic device within a process chamber, wherein the electronic device comprises a layer to be etched; providing a gaseous precursor mixture, wherein the gaseous precursor mixture comprises fluorine and a noble gas; exposing the gaseous precursor mixture to ultraviolet radiation to form a noble gas fluoride; and exposing the electronic device to the noble gas fluoride.

In another aspect, a method of fabricating an electronic device is provided, comprising providing an electronic device within a process chamber, wherein the electronic device comprises a layer to be etched; releasing an etchant into the process chamber, wherein the etchant comprises a noble gas fluorine, the etchant reacting with the layer to be etched to form elemental noble gas as a byproduct; releasing fluorine into the process chamber; and exposing the fluorine and the elemental noble gas to ultraviolet radiation to generate additional noble gas fluorine.

DETAILED DESCRIPTION

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

The fabrication of MEMS devices or other electronic devices may include the etching of a layer such as a sacrificial layer. As the etchants used may be costly, an increase in the efficiency of the etching process may reduce the cost of the fabrication process by using less etchant. In one embodiment, unused etchant may be recirculated into the etching process, and other byproducts of the etching process may be removed. In another embodiment, components of the etchant, such as xenon, may be separated from the byproducts and used to generate additional etchant. In other embodiments, either one or both of the etchant and sacrificial layer may be modified to increase the efficiency of the etching process, or to enable the use of less costly etchants.

Figure 1:
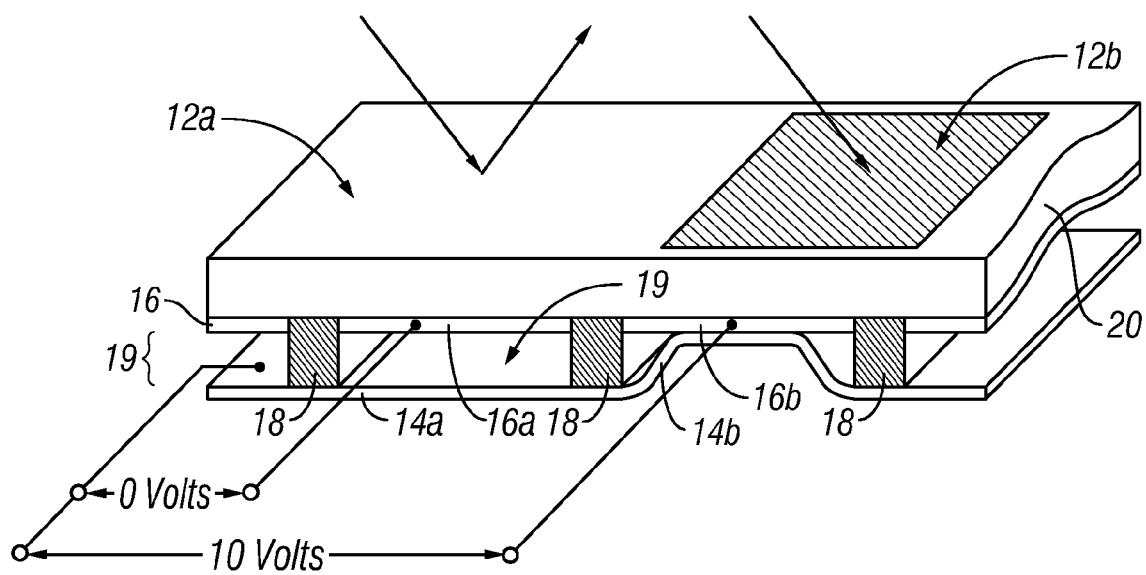
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
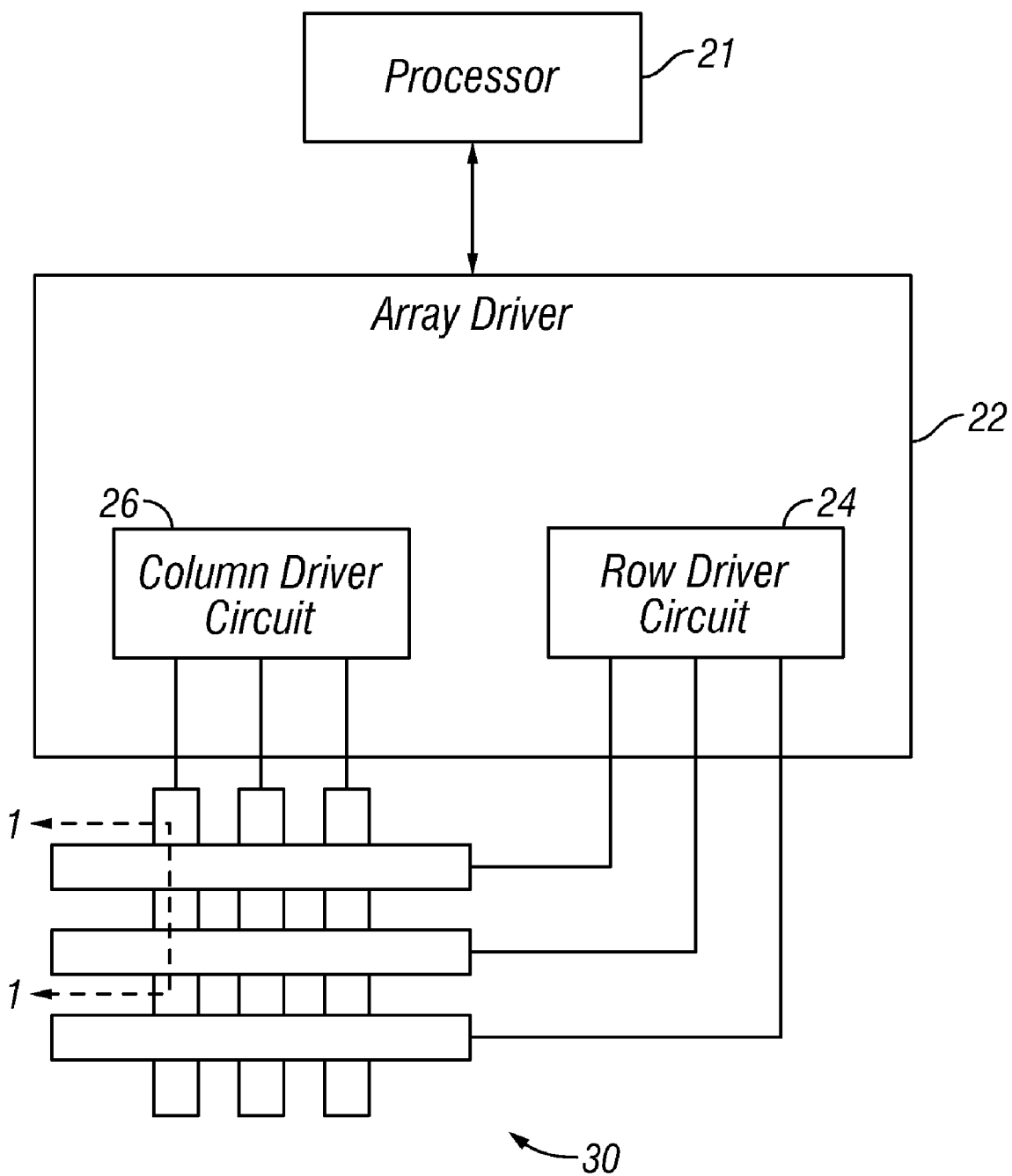
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
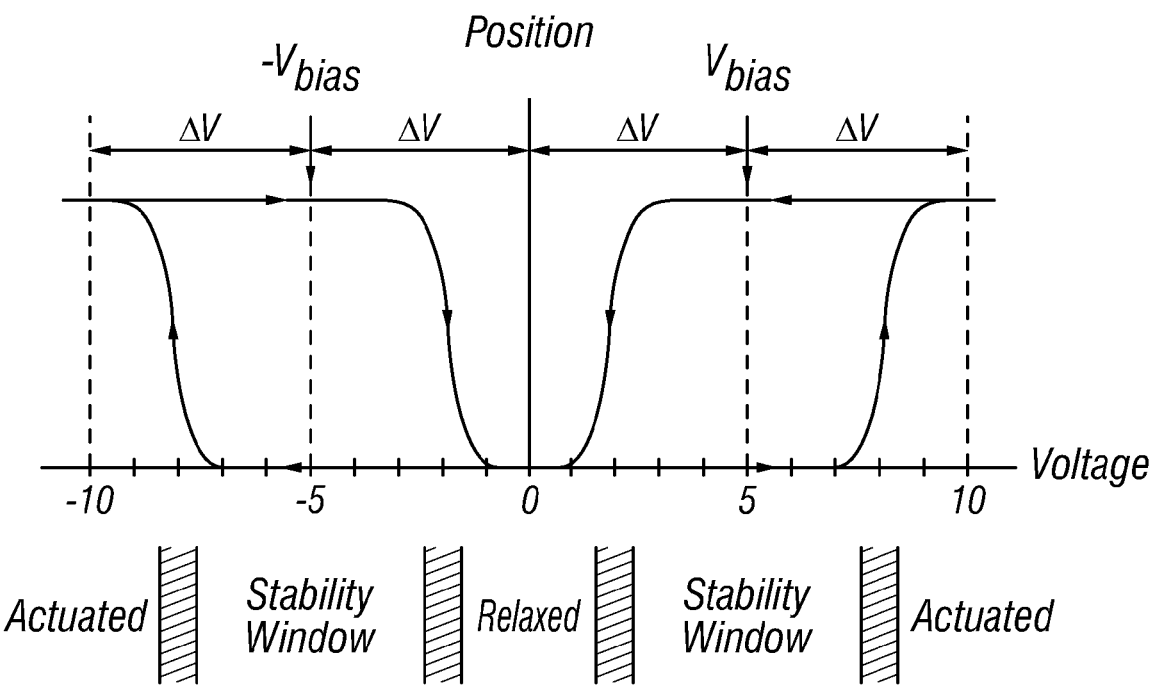
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
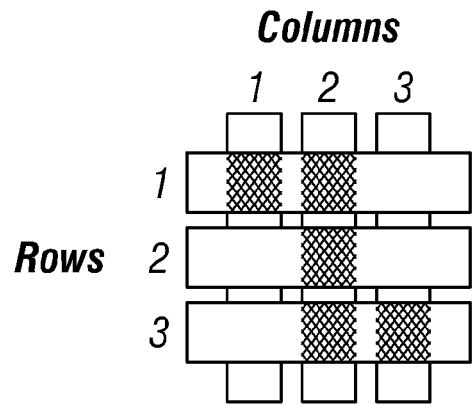
FIG. 5A illustrates one exemplary frame of display data in the 3×3 interferometric modulator display of FIG. 2.
Figure 5B:
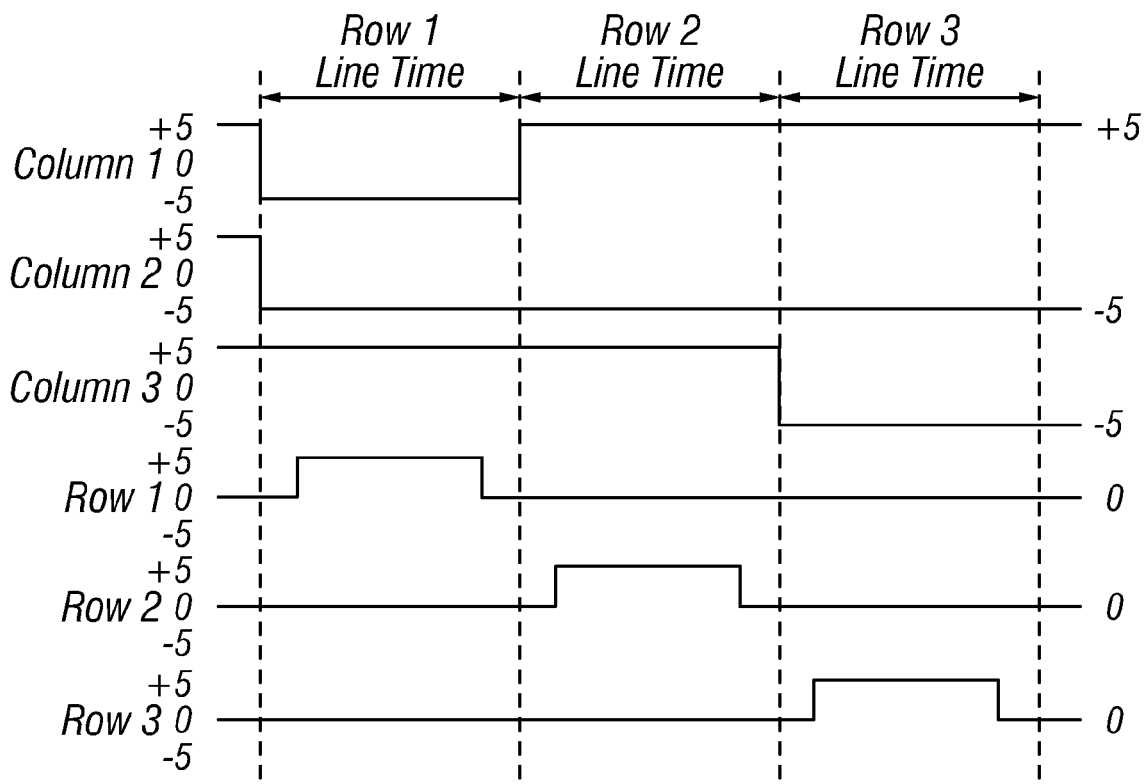
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
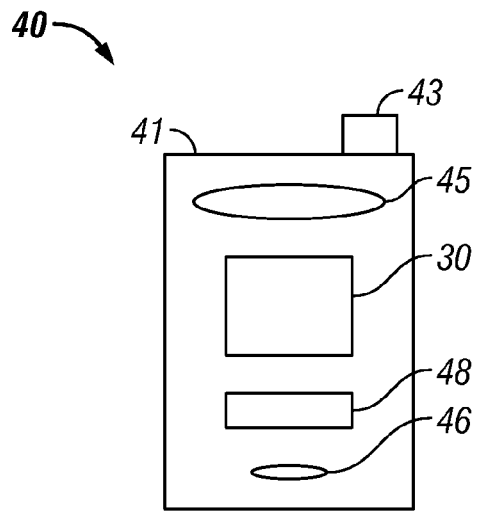
FIGS. 6A and 6B are system block diagrams illustrating an embodiment of a visual display device comprising a plurality of interferometric modulators.
Figure 6B:
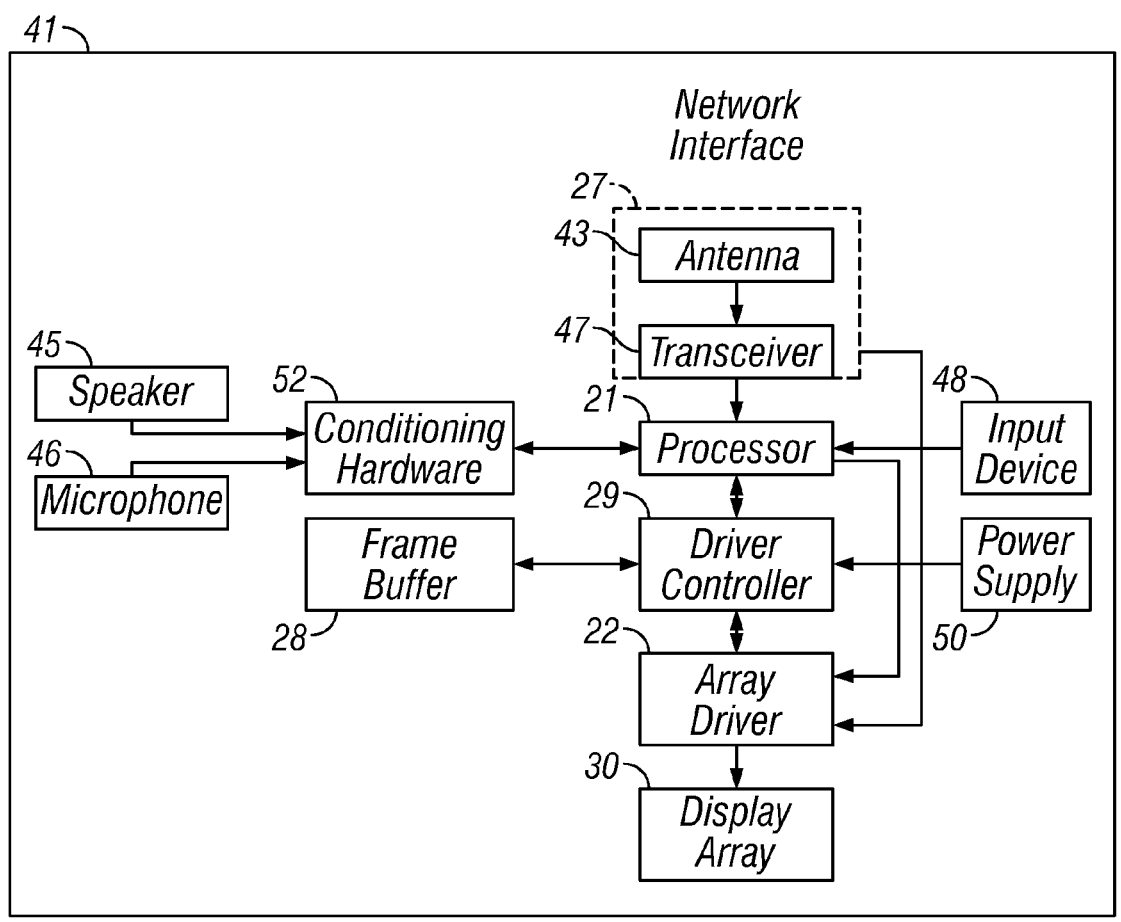

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
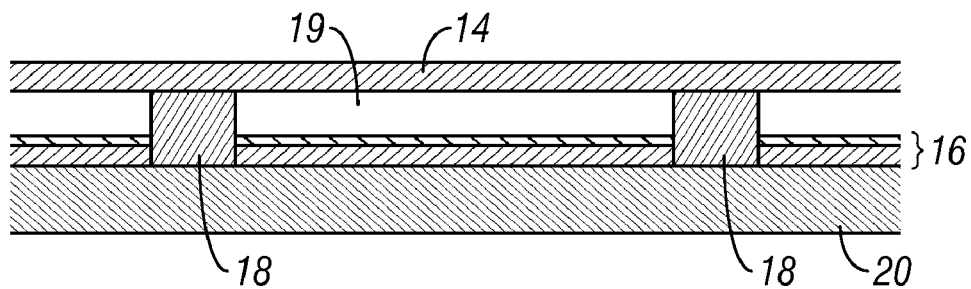
FIG. 7A is a cross section of the device of FIG. 1.
Figure 7B:
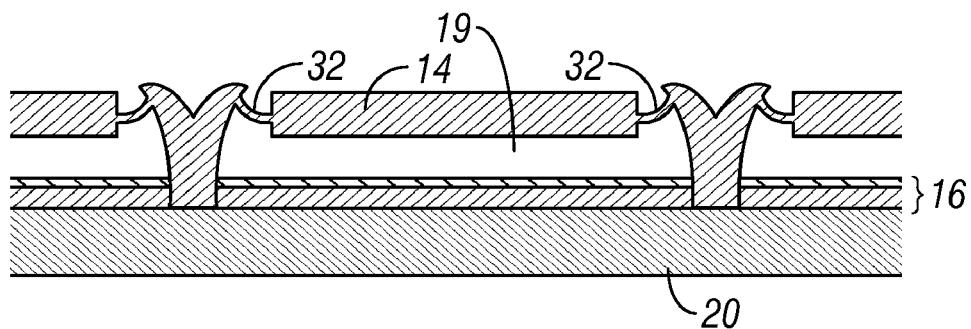
FIG. 7B is a cross section of an alternative embodiment of an interferometric modulator.
Figure 7C:
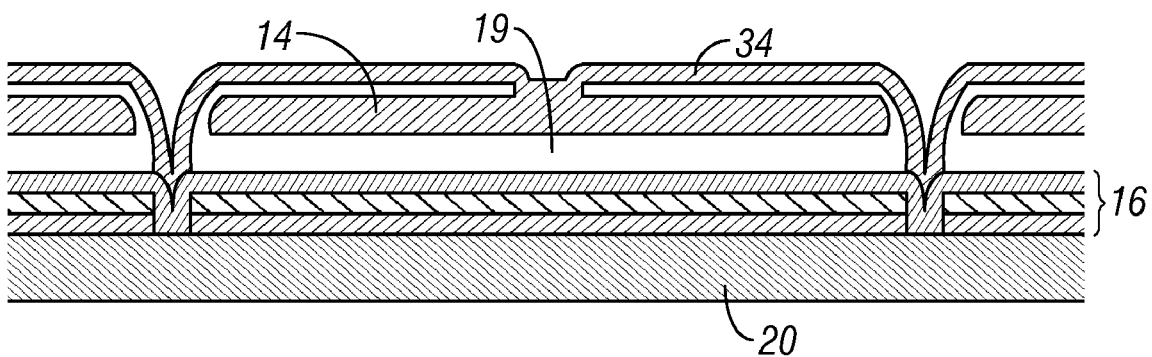
FIG. 7C is a cross section of another alternative embodiment of an interferometric modulator.
Figure 7D:
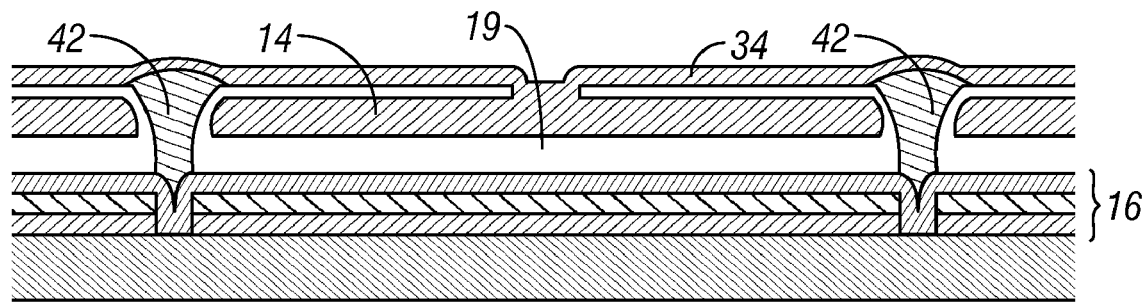
FIG. 7D is a cross section of yet another alternative embodiment of an interferometric modulator.
Figure 7E:
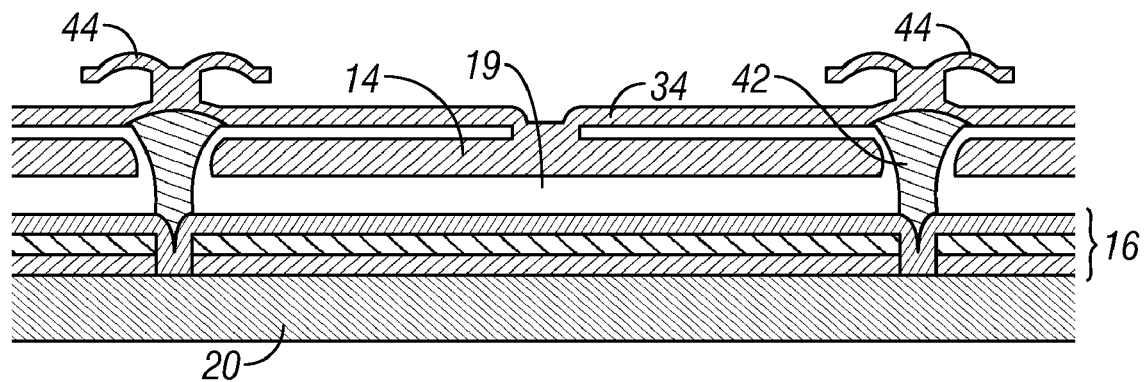
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
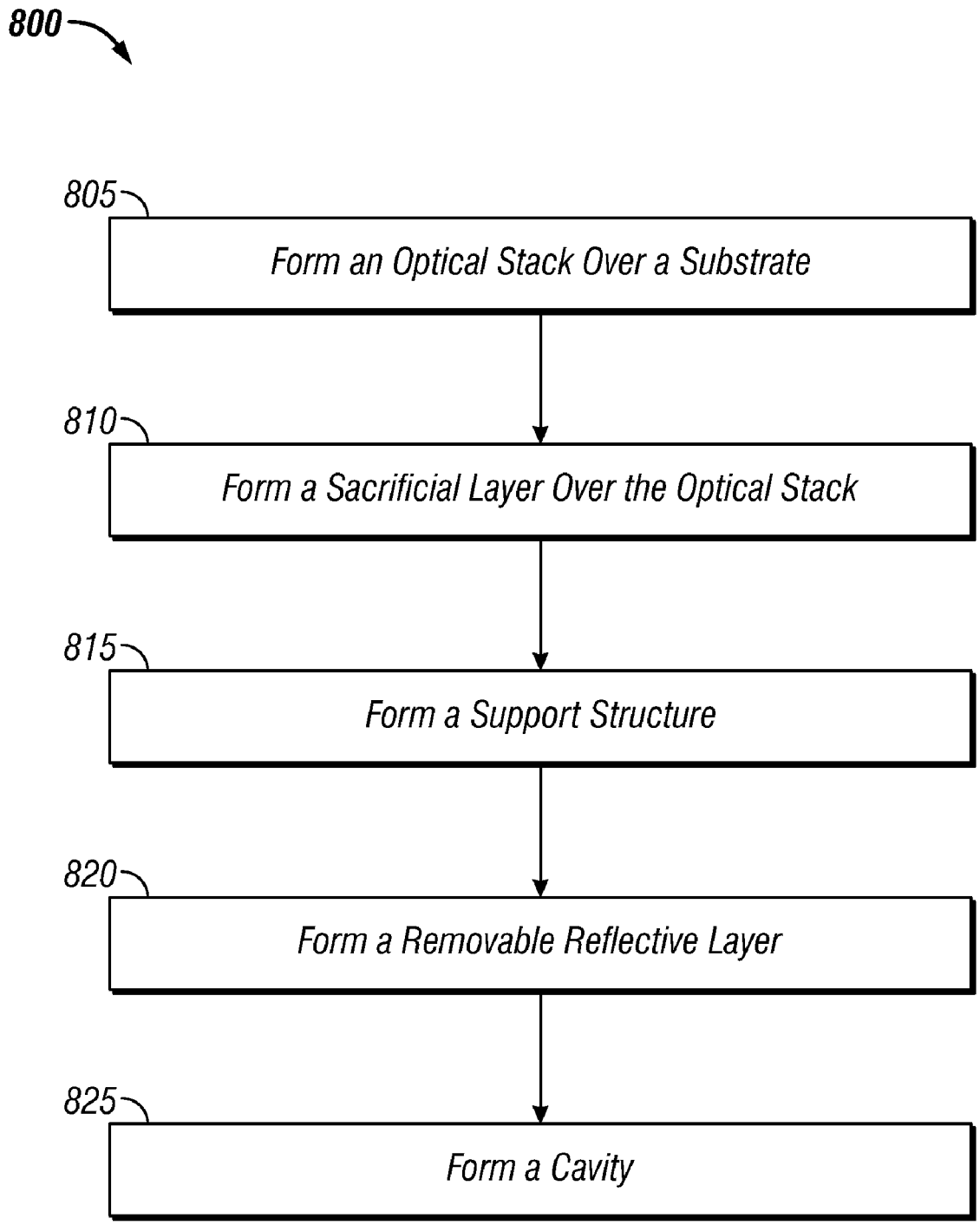
FIG. 8 is a flow diagram illustrating certain steps in an embodiment of a method of making an interferometric modulator.
Figure 9A:
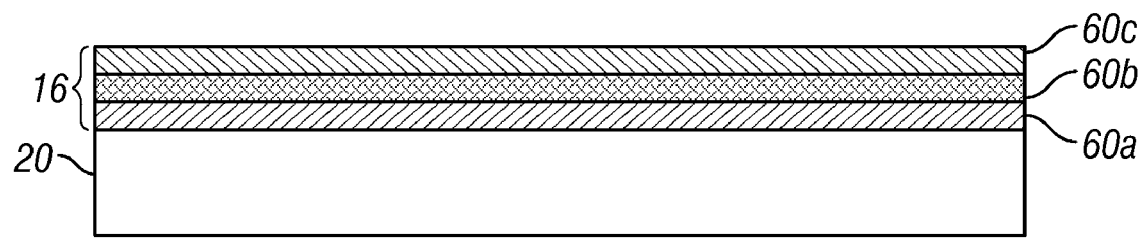
FIGS. 9A-9E are cross-sectional schematic illustrations of various stages in a method of making an interferometric modulator.

FIG. 8 is a flow chart illustrating an embodiment of an exemplary manufacturing process 800 for an interferometric modulator, and FIGS. 9A-9E schematically illustrate corresponding stages in one embodiment of such a manufacturing process. Such steps may be present in a process for manufacturing, e.g., interferometric modulators of the general type illustrated in FIGS. 1 and 7, along with other steps not shown in FIG. 16. With reference to FIGS. 1, 7 and 8, the process 800 begins at step 805 with the formation of the optical stack 16 over the substrate 20. FIG. 9A illustrates such an optical stack 16 formed over the substrate 20. The substrate 20 may be a transparent substrate such as glass or plastic and may have been subjected to prior preparation step(s), e.g., cleaning, to facilitate efficient formation of the optical stack 16. As discussed above, the optical stack 16 is electrically conductive, partially transparent and partially reflective in some embodiments and may be fabricated, for example, by depositing one or more of the layers onto the transparent substrate 20. In particular, it can be seen that the optical stack of FIG. 9A comprises a multilayer structure comprising sublayers 60a, 60b, and 60c, although more or fewer sublayers may be included in other embodiments. In some embodiments, one of the sublayers comprises a partially reflective layer or absorber layer selected for its optical properties, and another sublayer comprises a layer selected for its conductive properties. In other embodiments, a single sublayer having suitable optical and electrical properties may be used. In some embodiments, one or more of the sublayers are patterned into parallel strips, and may form row electrodes in a display device. Such patterning may be done in some embodiments by a masking and etching process, but alternative methods of patterning are discussed in greater detail below. In some embodiments, the optical stack 16 includes an insulating or dielectric, such as sublayer 60c of FIG. 9A, layer that is deposited over one or more metal layers (e.g., reflective and/or conductive layers such as sublayers 60a or 60b).

Figure 9B:
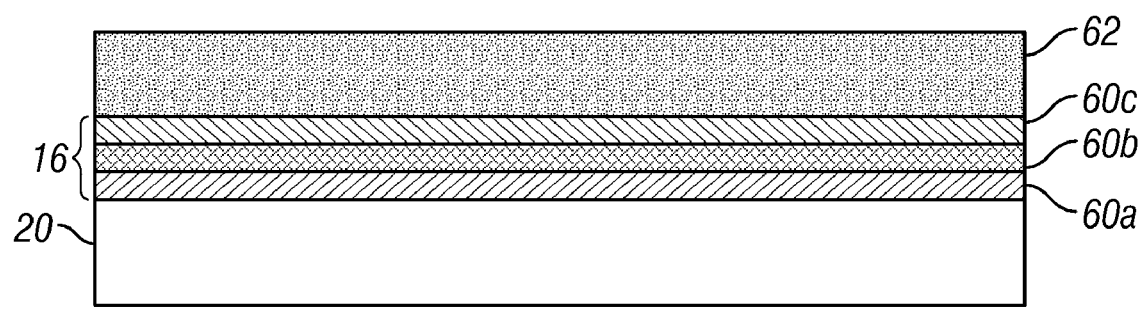

The process 800 illustrated in FIG. 8 continues at step 810 with the formation of a sacrificial layer over the optical stack 16. The sacrificial layer is later removed (e.g., at step 825) to form the cavity 19 as discussed below and thus the sacrificial layer is not shown in the resulting interferometric modulator 12 illustrated in FIG. 1. FIG. 9B illustrates a partially fabricated device comprising a sacrificial layer 62 formed over the optical stack 16. The formation of the sacrificial layer 62 over the optical stack 16 may include deposition of a $XeF_2$-etchable material such as molybdenum or amorphous silicon, in a thickness selected to provide, after subsequent removal, a cavity 19 (see FIGS. 1 and 9E) having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

Figure 9C:
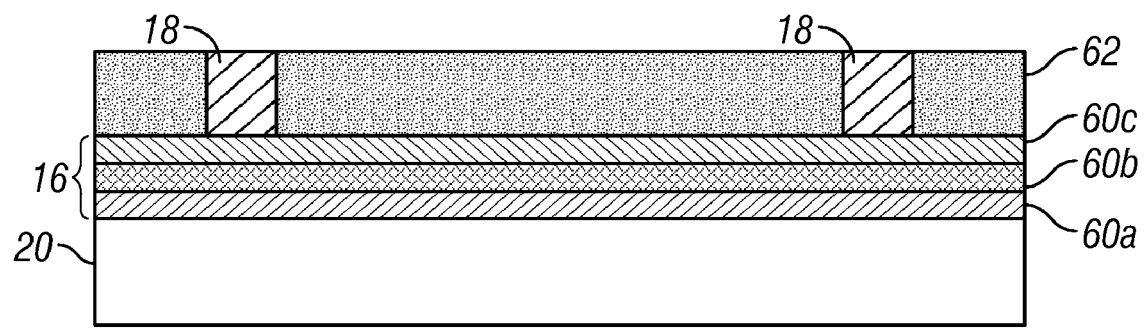

The process 800 illustrated in FIG. 8 continues at step 815 with the formation of a support structure e.g., a post 18 as illustrated in FIGS. 1, 7 and 9C. The formation of the post 18 may include the steps of patterning the sacrificial layer to form a support structure aperture, then depositing a material (e.g., a polymer or a silicon oxide) into the aperture to form the post 18, using a deposition method such as PECVD, thermal CVD, or spin-coating. In some embodiments, the support structure aperture formed in the sacrificial layer extends through both the sacrificial layer and the optical stack 16 to the underlying substrate 20, so that the lower end of the post 18 contacts the substrate 20 as illustrated in FIG. 7A. In other embodiments, such as the embodiment illustrated in FIG. 9C, the aperture formed in the sacrificial layer extends through the sacrificial layer, but not through the optical stack 16. For example, FIG. 7D illustrates the lower end of the support post plugs 42 in contact with the optical stack 16. In certain embodiments, the post 18 or other support structures may be formed by depositing a layer of support structure material over the sacrificial layer and patterning portions of the support structure material located away from apertures in the sacrificial layer. In some embodiments, the support structures may be located within the apertures, as illustrated in FIG. 9C, but in other embodiments at least a portion of the support structure may extend over a portion of the sacrificial layer. As noted above, the patterning of the sacrificial layer and/or the support posts may be done by a patterning and etching process, but may also be done by alternative etching methods discussed below.

Figure 9D:
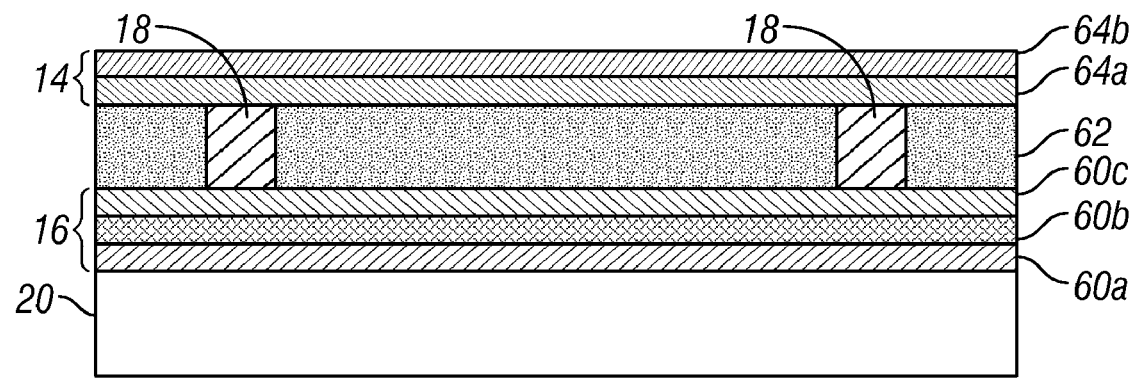

The process 800 illustrated in FIG. 8 continues at step 820 with the formation of a movable reflective layer or membrane such as the movable reflective layer 14 illustrated in FIGS. 1, 7 and 9D. The movable reflective layer 14 may be formed by employing one or more deposition steps, e.g., reflective layer (e.g., aluminum, aluminum alloy) deposition, along with one or more patterning, masking, and/or etching steps. As discussed above, the movable reflective layer 14 is typically electrically conductive, and may be referred to herein as an electrically conductive layer. In certain embodiments, the movable reflective layer 14 may comprise a plurality of sublayers as shown in FIG. 9D. In certain embodiments, one of the sublayers 64a may comprise a highly reflective sublayer selected for its optical properties, and another sublayer 64b may comprise a mechanical sublayer selected for its mechanical properties. Since the sacrificial layer is still present in the partially fabricated interferometric modulator formed at step 820 of the process 800, the movable reflective layer 14 is typically not movable at this stage. A partially fabricated interferometric modulator that contains a sacrificial layer may be referred to herein as an "unreleased" interferometric modulator.

Figure 9E:
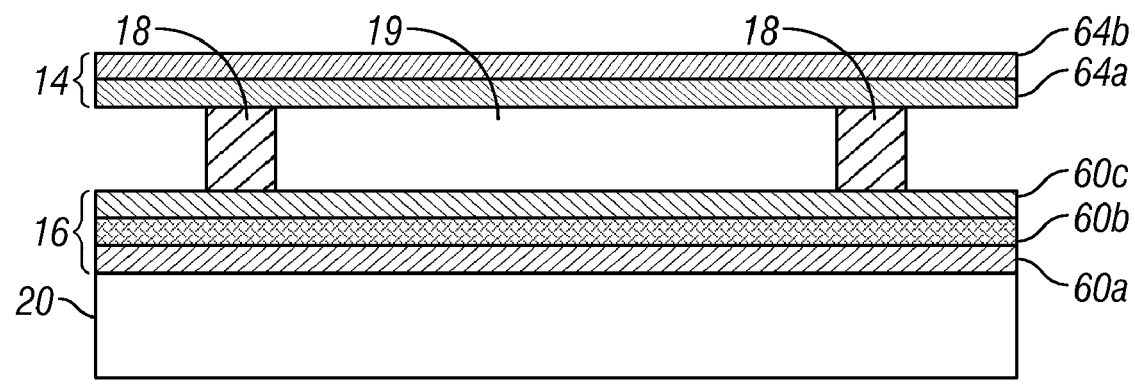

The process 800 illustrated in FIG. 8 continues at step 825 with the formation of a cavity, e.g., a cavity 19 as illustrated in FIGS. 1, 7, and 9E. The cavity 19 may be formed by exposing the sacrificial material 62 (deposited at step 810) to an etchant. For example, an etchable sacrificial material such as molybdenum or amorphous silicon may be removed by dry chemical etching, e.g., by exposing the sacrificial layer to a gaseous or vaporous etchant, such as vapors derived from solid xenon difluoride ($XeF_2$) for a period of time that is effective to remove the desired amount of material, typically selectively relative to the structures surrounding the cavity 19. Other etching methods, e.g. wet etching and/or plasma etching, may also be used, and certain alternate etching methods are discussed in greater detail below. Since the sacrificial layer is removed during step 825 of the process 800, the movable reflective layer 14 is typically movable after this stage. After removal of the sacrificial material, the resulting fully or partially fabricated interferometric modulator may be referred to herein as a "released" interferometric modulator.

As will be understood, the process of removal of a sacrificial layer via an etching process may also be applied to other MEMS devices which comprise a gap or other spacing between adjacent components, and is not limited to utilization with the exemplary interferometric modulator described herein. As described above, this removal may be done via a variety of different processes, including but not limited to wet etches, dry etches, and plasma etches. The $XeF_2$ dry etch described above can be used in conjunction with sacrificial layers such as molybdenum, germanium, and silicon, for example. This process involves the use of an etching process gas that contains $XeF_2$ as the primary etchant, and that optionally contains other etchant (such as oxygen) and/or inert carrier gases. As will be discussed in greater detail below, although several of the methods below are discussed with respect to the use of $XeF_2$ as the primary etchant, the methods may be adapted to utilize other noble gas fluorides, such as $KrF_2$, in place of $XeF_2$.

In certain embodiments, the manufacturing processes and equipment used to manufacture MEMS devices using a $XeF_2$ sacrificial etch may be modified so as to recover the $XeF_2$ and/or to recover the xenon (Xe) component of the $XeF_2$. The recovered $XeF_2$ may be recycled for use in additional etching processes. The recovered Xe may be reacted with $F_2$ used to generate $XeF_2$, which may also be recycled for use in additional etching processes. During or after the etching process, the process gases may be collected from the etch chamber and then processed as desired. The process gases may include the unused $XeF_2$ (or other etchant), by-products of the etching reaction, impurities and any carrier gases which may be present. When other noble gas fluorides are used, either or both of the unused noble gas fluorides and the corresponding noble gas component may be recovered.

The reaction byproducts are the products of the etching reactions between the $XeF_2$ etchant and the sacrificial layer, and it will be understood that the byproducts will differ depending on, at least, the nature of the etchant and sacrificial layer used. For an embodiment in which the sacrificial layer comprises molybdenum, the byproducts will typically include $MoF_x$ (where x is an integer in the range of 2 to 6), and for an embodiment in which silicon is used as the sacrificial layer, the byproducts will typically include $Si_xF_y$ (where x is an integer in the range of 1 to 2, and where y is an integer in the range of 2 to 6). Where additional etchants (e.g., oxygen) are used in conjunction with the $XeF_2$ etchant, the byproducts may include complex fluorides of the sacrificial element (e.g., $MoO_xF_y$).

Common impurities that may be present in the etching process gas include $H_2O$, HF, $CF_x$, $CHF_x$, $COF_x$, CO, $CO_2$, residues of purging gases and trace amounts of metal fluorites. It will also be understood that the etching process gases may contain reaction intermediates, such as XeF or F, but because these reaction intermediates have comparatively short lifetimes before they react further to form the reaction byproducts, they are not separately discussed below.

In order to recover and/or recycle xenon, the unique physical properties of xenon may be utilized, such as the relatively low boiling point and inertness. These physical and chemical properties may be used to facilitate separation of the xenon from the other process gases and other materials which may be collected during the etching process.

Figure 10:
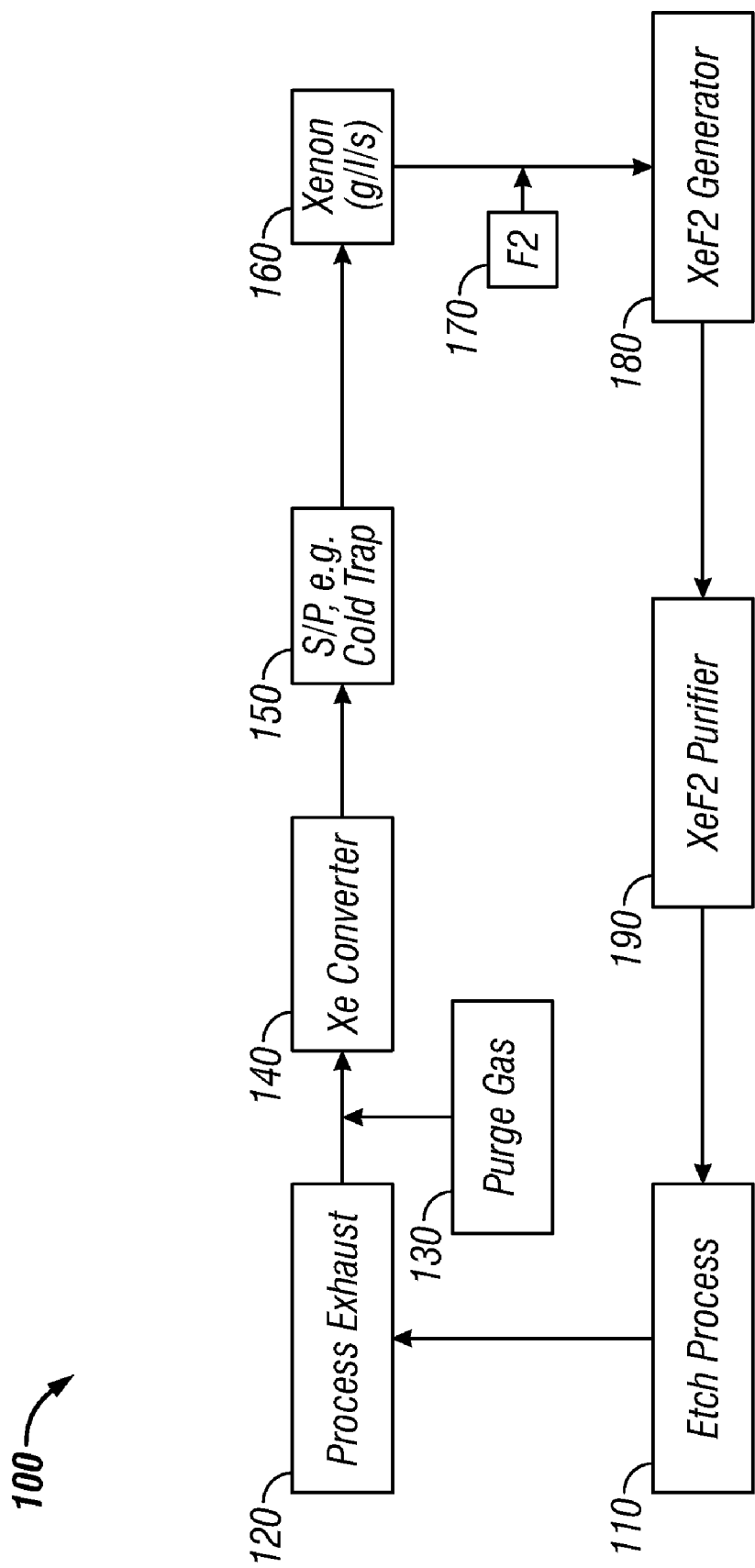
FIG. 10 is a flow diagram of an example of a process flow which isolates elemental xenon and generates $XeF_2$.

FIG. 10 illustrates a generalized process flow 100 which may be used to extract Xe from the process gases and utilize the collected Xe to generate $XeF_2$ for use in the etch process. It will be understood, however, that the process may be modified in a variety of ways, including the addition or removal of steps, and that the steps may be performed in a different order. The process begins at a etch process step 110 wherein a MEMS device or other device to be fabricated is exposed to $XeF_2$ gas. In step 120, the process gases are collected, such as through the collection of process exhaust from the etching reaction chamber. In step 130, the system may be exposed to purge gas so as to drive the process flow. In step 140, a Xe converter is utilized to generate Xe from the collected process gases. In step 150, the generated Xe is separated from the remainder of the process gases and purified, such as through the use of a cold trap. This separated Xe may be pressurized or condensed in a step 160. Fluorine ($F_2$) may be added in a step 170, and $XeF_2$ generated in a step 180. The $XeF_2$ may be purified in a step 190 before being returned to the etch process.

A variety of methods and devices may be used to convert recovered Xe-containing species to elemental Xe. For example, xenon converters may comprise liquid bath converters, solid bed converters, or gas bath converters, each of which will be discussed in turn. The Xe-containing species to be converted may comprise primarily unused $XeF_2$, in addition to other impurity or intermediate xenon fluorides, as well as complex fluorides if co-etchants in addition to $XeF_2$ are used.

$XeF_2$ can react with water in a hydrolysis reaction to produce elemental Xe and $O_2$. However, in order to accelerate the conversion of $XeF_2$ to Xe, an acidic or basic solution may be used instead of a neutral aqueous solution. $XeF_2$ hydrolyzes with a first order rate constant of about $4.2 \times 10^{-4}$/sec in acidic solution at 298° K to release hydrofluoric acid, atomic xenon, and molecular oxygen according to the following reaction:

$$XeF_{2(g)} + H_2O_{(l)} \rightarrow HF_{(aq)} + Xe_{(g)}\uparrow + O_{2(g)}\uparrow$$

Basic solutions may also be used as the liquid bath solution, including for example, NaOH or KOH, and the selection of a particular basic solution allows generation of desired byproducts for a particular embodiment. In one embodiment, the use of basic solutions such as NaOH or KOH, in which hydroxide ($OH^-$) serves as a reducing agent, results in the generation of water, elemental xenon, and molecular oxygen according to the following reaction:

$$XeF_{2(g)} + 2HO^-_{(aq)} \rightarrow F^-_{(aq)} + H_2O_{(aq)} + Xe_{(g)}\uparrow + \frac{1}{2}O_{2(g)}\uparrow$$

In another embodiment, it can be seen that the use of an alternate reducing agent can yield different byproducts, which may be soluble products such as organic acid salts, rather than gases which will mix with the released Xe. In a particular embodiment, methanoate salts (also known as formate salts) such as sodium methanoate (also known as sodium formate) may be used, in accordance with the following reaction:

$$XeF_{2(g)} + 4HCOO^-_{(l)} \rightarrow 2F^-_{(aq)} + CO_{3(aq)}^{2-} + 2H_2O_{(aq)} + Xe_{(g)}\uparrow$$

Furthermore, if the sacrificial materials are metals, such as Mo and W, their gaseous etching byproducts (such as $MoF_x$), will typically hydrolyze in the basic solution. The gases emerging from the liquid bath Xe converter thus include elemental Xe, in addition to water vapor and any purge gases used. In a particular embodiment, the purge gas and bath solution may be selected such that the purge gas is absorbed by the solution, along with any etching byproducts, so as to provide a Xe converter which performs multiple functions. In a particular embodiment, $CO_2$ may be used as the purge gas, and an aqueous solution containing sodium methanoate and sodium hydroxide is used in the converting bath, the $XeF_2$ will be converted to elemental Xe, and the purge gas and the byproducts of the etching process will be absorbed.

In other embodiments, solid bed converters or gas bath converters may be used as the Xe converter. A solid bed converter may comprise any reducing agent which reduces xenon fluorides to elemental Xe. For certain of these reducing agents, such as nickel, copper, and iron, the $XeF_2$ will react to form solid fluorides on the surfaces of the materials, via adsorption or absorption reactions. Other reducing agents include, but are not limited to, materials that form solid fluorides or sub-fluorides, sub-oxides, sub-nitride, sub-halogen compounds or organic salts. In other embodiments, materials such as silicon, molybdenum or germanium may be used as reducing agents, and may result in the formation of gas or liquid fluorides, rather than solid fluorides (e.g., depending on the pressure). Other similar reducing agents include materials that form gaseous fluorides and sub-fluorides, sub-oxides, sub-nitride, sub-halogen compounds, organics or polymer. Similarly, gaseous reduction agents can be used in gas bath converters, and may comprise, for example, organics such as ethane, ethylene, and formaldehyde, or inorganics such as ammonia, hydrazine, and phosphine.

Once elemental xenon has been obtained within the process gases, the xenon may be separated from the other process gases and purified. The selection of a process for separating the elemental xenon from the other materials will depend in large part on the other gases or other materials present with the xenon at this point in the recycling process, which in turn are dependant upon the combination of etchant(s) and sacrificial materials used, as well as the presence and specifics of the Xe converter.

One method of separating and purifying elemental xenon is a cryogenic trap, which may also be referred to as a cold trap. As noble gases have low boiling points (the boiling point of Xenon is 165° K, the boiling point of argon is 87° K, and the boiling point of He is 4.2° K), the process gases can be driven through a cold trap at a temperature which is above the boiling point of the noble gas, but sufficiently low that the remaining components of the process gases will condense, leaving a mixture which is substantially composed of the noble gas, with only trace amounts of other materials. When $XeF_2$ is used as an etchant, and Mo is used as a sacrificial layer, a trap that is cooled with, for example, solid $CO_2$ (dry ice, typically used in conjunction with acetone) to a temperature below the sublimation point of $CO_2$, can be used to cause condensation of the other gases, including etching byproducts such as $MoF_x$, as their boiling points are significantly higher. The majority of the moisture within the process gases will also typically be condensed (the remaining amount of water in the gas after passing through the $CO_2$ trap may have a partial pressure on the order of 0.2 mTorr), and subsequent processes, such as the use of a CaO desiccant, may be used to further remove moisture.

Figure 11:
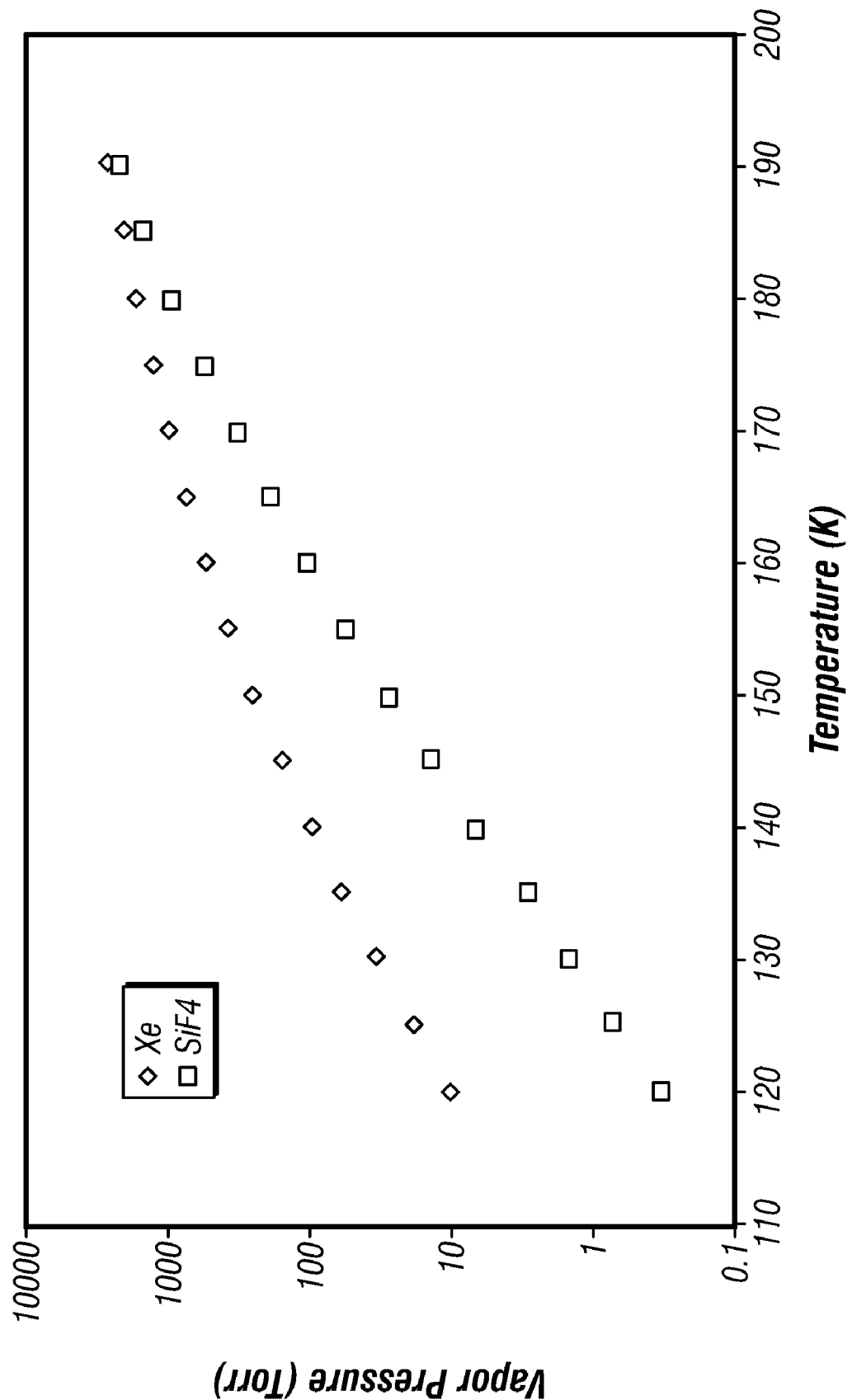
FIG. 11 is a plot of the vapor pressures of Xe and $SiF_4$ as a function of temperature.

In other embodiments, the process gases may comprise a material which has a boiling point similar to that of elemental xenon. For example, if Si is used as a sacrificial material, one of the primary byproducts of the etching process is $SiF_4$, which has a boiling point of 187° K, close to that of Xe. FIG. 11 illustrates the vapor pressures of Xe and $SiF_4$ as a function of temperature. It can be seen that the vapor pressure of $SiF_4$ is roughly 189 Torr at the boiling point of Xe, and thus if the cold trap were at 165° K (the boiling point of Xe), the vapor pressure of $SiF_4$ would still be 189 Torr, and thus significant amounts of $SiF_4$ would likely pass through the cold trap. It can also be seen in FIG. 11 that at lower temperatures, the difference between the vapor pressure of Xe and $SiF_4$ increases. Thus, at 125° K, the vapor pressure of Xe is 19.5 Torr and the vapor pressure of $SiF_4$ is 0.75 Torr, and at 120° K, these values decrease to 11.1 Torr and less than 0.4 Torr, respectively. By adding an active chemical agent, such as NaF, $SiF_4$ can be further eliminated. In one embodiment, in the presence of NaF, the equilibrium $SiF_4$ vapor pressure may be reduced to 10-47 Torr at room temperature, as the NaF will react with the $SiF_4$ according to the following reaction $$SiF_4(g) + NaF(s) \rightarrow Na_2SiF_6(s)$$

Other alkaline and earth alkaline fluorides can be used to reduce the presence of $SiF_4$, as well.

Cold traps at such low temperatures may be provided in a variety of ways. In some embodiments, the cold trap is cooled via solid-liquid melting, such as via the use of chloroethene. In other embodiments, the cold trap is cooled via liquid-gas fusion, such as through the use of krypton. In still other embodiments, solid-liquid vaporization at low pressure may be used, such as solid $CF_4$ in propane. Melting and fusion systems are suitable for maintaining an accurate temperature over a prolonged period of time. Solid-liquid vaporization systems provide additional control over the temperature in the cold bath.

In a particular embodiment, solid $CF_4$ in propane may be used to provide a cold bath with a temperature in the range of 100° K-140° K, by varying the pressure from 5 Torr to 760 Torr. In certain embodiments, purge gases such as $N_2$ or He (which may have lower boiling points than xenon or another gas being separated and purified) may not be separated by an initial cold trap, as they will remain in gas form when the Xe remains in gas form. A subsequent cold trap, such as a liquid $N_2$ cold trap, may be used to condense the Xe, and the purge gas will remain in the gas phase.

This recycling method may be modified as described above in order to apply the method to recycle other noble gas-based etchants. For example, this method may be used to recycle noble gases from xenon fluorides (such as $XeF_4$, $XeF_6$, $XeF_8$ and $XeF_2.XeF_4$, etc.), xenon halogen fluorides (such as $XeCl_2F_2$ and $XeClF_5$, etc.) xenon oxyfluorides ($XeOF_2$, $XeOF_4$, $XeO_2F_2$, $XeOF_6$, etc.), other xenon compounds (such as $XeO_3$ and $XeO_4$, etc.) and other noble gas compounds ($KrF_2$, etc.). Certain of the methods described above may be more effective for different chemistries. Routine experimentation guided by the disclosure provided herein may be used to identify suitable conditions for particular situations.

It will also be understood that different methods may be used to separate $XeF_2$ from the process gases than those used to separate $X_e$. The separation of $XeF_2$ may also be done during the etch process to increase the efficiency of the etch process, as discussed in greater detail below. The separation of either $XeF_2$ or Xe may be done via any of the methods described herein, and may be done by utilizing their physical or chemical properties. For example, differences in vapor pressure may be utilized during a vacuum distillation or condensation process, differences in phase change temperatures such as boiling or melting points may be utilized in distillation and filtration processes, differences in solubility may be utilized in an extraction process, or differences in crystal structures may be used in recrystallization processes. Other properties such as ionization energy, molecular weight, diffusivity, density, absorption, adsorption, and chromatographic properties may be used to separate materials.

In one particular embodiment, $XeF_2$ may be a comparatively large molecule compared to the other molecules in the process gases. Using size-discrimination membranes or molecular sieves, the $XeF_2$ may be separated from the other molecules and may be returned to the process, sometimes after additional purification.

Figure 12:
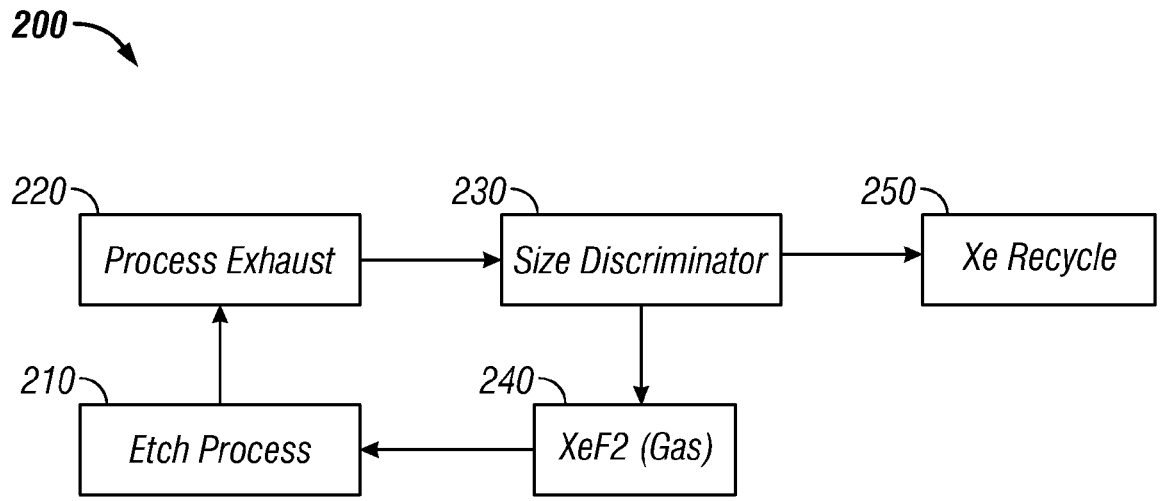
FIG. 12 is a flow diagram of a process flow which recycles unused $XeF_2$ utilizing a size discriminator.

FIG. 12 illustrates an embodiment of such a process 200, which begins at a step 210 in which a $XeF_2$ etch is used during an etching process. In step 220, the process gases may be exhausted from the etch chamber. In step 230, the $XeF_2$ is separated from the other molecules (including elemental Xe) through the use of a size discriminator, such as the size-discrimination membrane or molecular sieve, or another suitable method of separating the $XeF_2$. The separated $XeF_2$ may be returned to the etch process in a step 240 and the elemental Xe may itself be recycled in some manner in a step 250.

A cold trap may also be used to separate the $XeF_2$, in a similar manner to the separation of elemental Xe discussed above. When $XeF_2$ is used as an etchant, and Mo is used as a sacrificial layer, the primary etching byproduct is $MoF_6$. A suitable temperature for the cold trap is about 230° K, although it will be understood that temperatures both above and below 230° K may be used. At 230° K, the vapor pressure of $MoF_6$ is several Torr, while that of $XeF_2$ is below 0.1 Torr. This temperature may be maintained in a variety of ways, such as through the use of solid-liquid tetrachloroethane, which will maintain a temperature of roughly 230.8° K at 1 atmosphere, or liquid-gas chlolodifluoridomethane, which will maintain a temperature of about 232.5° K at 1 atmosphere.

Figure 13:
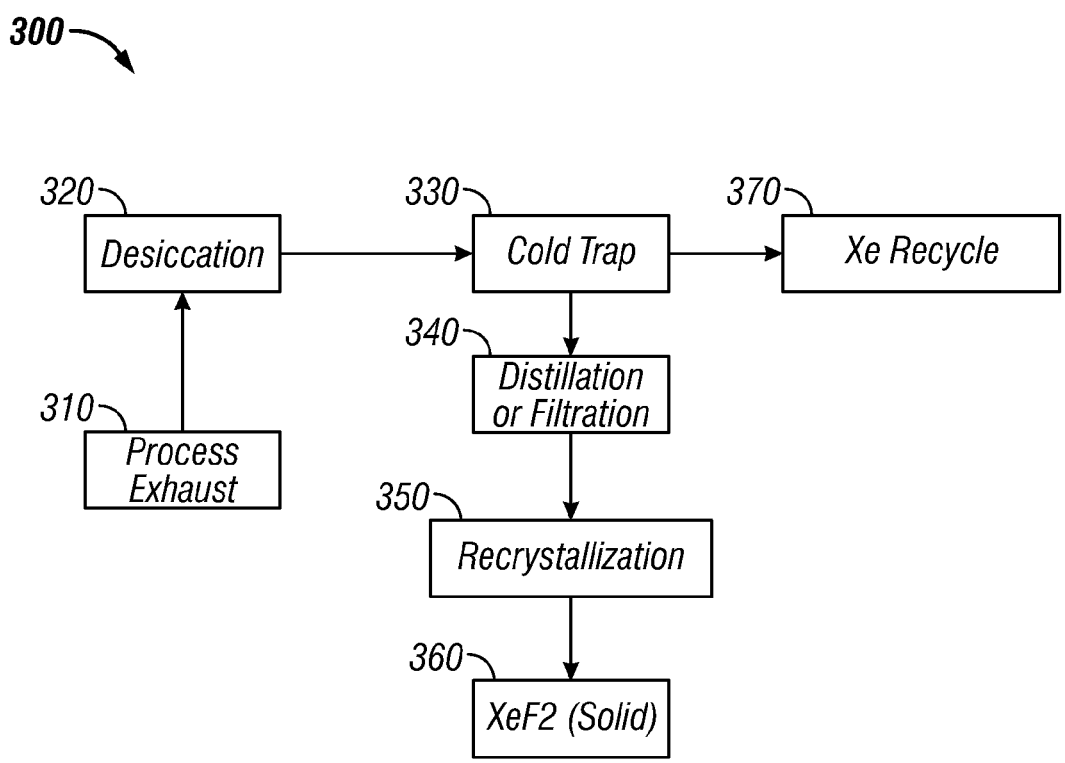
FIG. 13 is a flow diagram of a process flow which recycles unused $XeF_2$ utilizing a cold trap.

FIG. 13 illustrates an exemplary process 300 for the separation and collection of $XeF_2$ using a cold trap. In step 310, the process exhaust is collected. In a step 320, water vapor may be removed from the process gases via the use of a desiccant. The process may then move to a step 330 where the $XeF_2$ is removed from the other process gases using a cold trap. The process may also include a step 370 where the elemental Xe separated from the $XeF_2$ in the cold trap is recycled. After the $XeF_2$ is separated via the cold trap in step 330, the $XeF_2$ may be further purified in a step 340 wherein the $XeF_2$ undergoes a distillation or filtration process, and a step 350 wherein the $XeF_2$ is recrystallized. In particular, the $XeF_2$ may be vaporized at one location and then recrystallized at another location. In some embodiments, steps 340 and 350 may be repeated as necessary to obtain a desired level of purity. Finally, in a step 360, sufficiently pure $XeF_2$ may be obtained, which may be in a solid form if the recrystallization step 350 is performed.

As noted above, many different methods may be used to separate $XeF_2$, and the suitability of a particular method will depend in large part on the other materials from which the $XeF_2$ is to be separated. In an embodiment in which $XeF_2$ is used as an etchant and Mo is used as a sacrificial layer, the primary byproduct will typically be $MoF_6$, as noted above. At a temperature in the range of about 290° K to 307° K, and at one atmosphere, $MoF_6$ is a liquid and $XeF_2$ is a solid. Thus, filtration at room temperature may be used to separate the solid and the liquid.

Collected elemental Xe may be used to generate $XeF_2$, as noted above. In one embodiment, the Xe can be exposed to $F_2$ at high pressure to form $XeF_2$, using nickel as a catalyst. In another embodiment, Xe may directly react with an approximately stoichiometrically equal twice amount of $F_2$ when exposed to heat, UV light, or irradiation from electrical discharge. In a particular embodiment, Xe and $F_2$ may be irradiated with UV light at a wavelength of about 250 nm to 350 nm, generating substantially pure $XeF_2$.

Thus, it will be understood that the various methods described above may be combined in various ways, and that certain steps may be modified, replaced, or left out altogether. In certain embodiments, elemental Xe may be extracted from the process exhaust, and may be stored for later recycling, or may be used to generate $XeF_2$ through the processes described above, or through other suitable processes. In other embodiments, unused $XeF_2$ may be separated and purified. In further embodiments, generated or separated $XeF_2$ may be returned to the etching process, as will be discussed in greater detail below.

Figure 14:
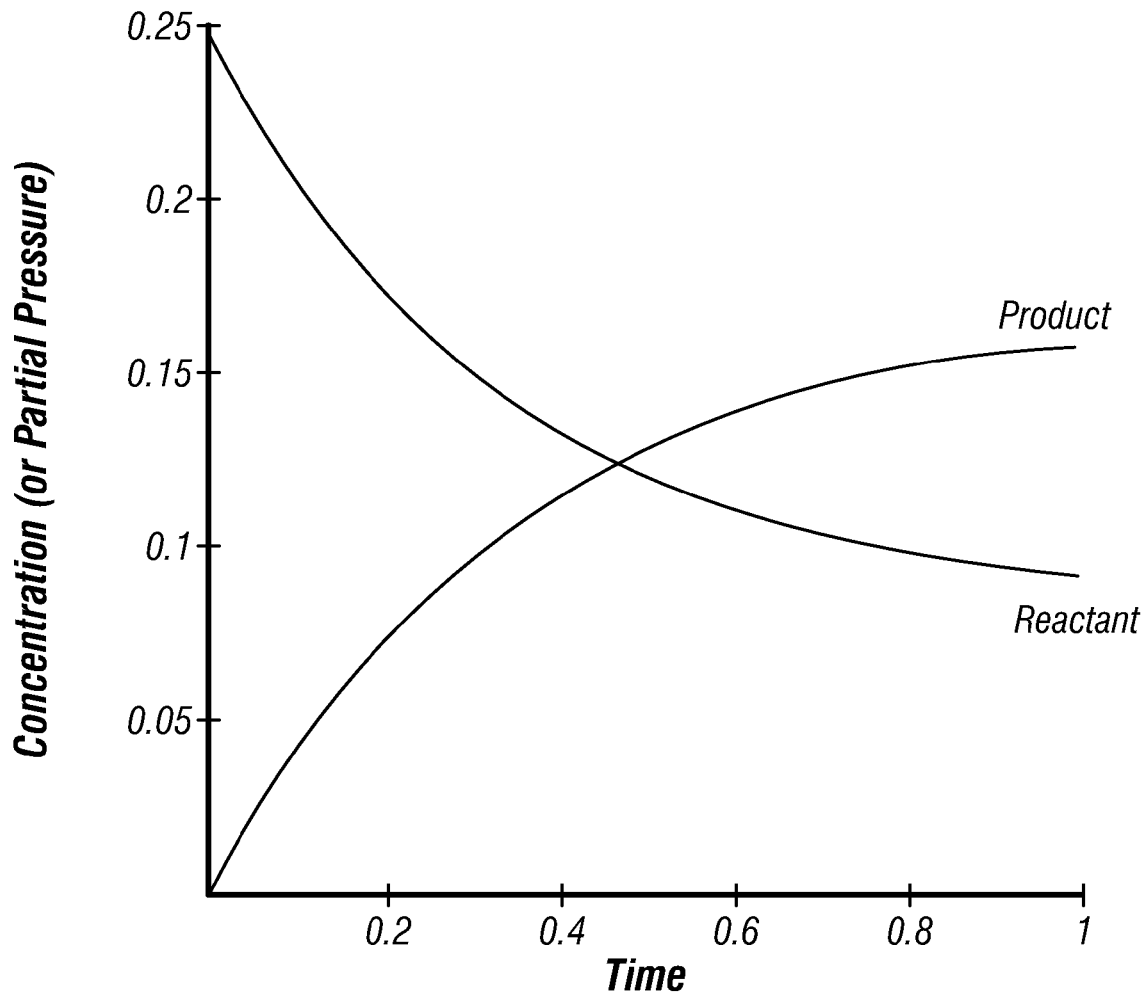
FIG. 14 is a plot illustrating the reactant composition of a typical chemical reaction.

FIG. 14 illustrates the reactant composition of a typical chemical reaction. The ratio of the pressure at equilibrium ($t=\infty$) to that at the beginning ($t=0$) can be used to determine the theoretical efficiency (i.e., the possible maximum). This determination may be calculated using the standard Gibbs free energy of the reactants and products, as understood by a person having ordinary skill in the art. In an etching process wherein $XeF_2$ at 1 Torr is used to etch a Mo sacrificial layer, and the molar ratio of Mo to $XeF_2$ is 1:3, the equilibrium pressure of $XeF_2$ at room temperature is roughly $1 \times 10^{-58}$ Torr, meaning that the theoretical efficiency is very close to 100%. Current estimates of the efficiency of actual etching processes are significantly below 100%, on the order of 50%. Suspected causes of the discrepancy between actual and theoretical efficiency include process conditions which are not in equilibrium and the etching processes being designed for overetch, to ensure removal of all of the sacrificial material. While these factors may prevent attainment of the theoretical maximum efficiency, the efficiency may nonetheless be improved, at least by moving forward the reaction coordination and modifying the etching process flow. The efficiency of the $XeF_2$ etching process may thus be improved.

In certain embodiments, the etching process may be modified to increase the release rate. Generally, the release rate may be expressed by the following relationship:

$$\text{Rate} = k \cdot A_{sac} \cdot P_{XeF2}{}^n \cdot P_{product1}{}^m \cdot P_{product2}{}^l \ldots$$

where k is a rate constant, $A_{sac}$ is the exposed surface area of the sacrificial materials, and P is the partial pressure for the respective products. The reaction orders for the various reactant and products are given by n, m, l, etc., and n is a positive number, while m and l are either zero or negative.

It can be seen that an increase in the exposed sacrificial material surface area $A_{sac}$ will increase the release rate of the etching process. In certain embodiments, this may be increased through the inclusion or addition of etch holes extending through an overlying layer and permitting access to the sacrificial layer. In further embodiments, these etch holes may be nano-size holes which permit the passage of $XeF_2$. For example, as compared to typical embodiments in which relatively few relatively large etch holes are provided and etching gasses and byproducts need to travel relatively far to exit the reaction area within the cavity as it is being formed, providing a relatively large number of relatively small nano-size holes decreases the distance within the cavity traversed by the etching gasses and byproducts, and may provide a faster release rate. In further embodiments, porous sacrificial materials may be used so as to increase the exposed surface area at a given point in the etching process.

Figure 15:
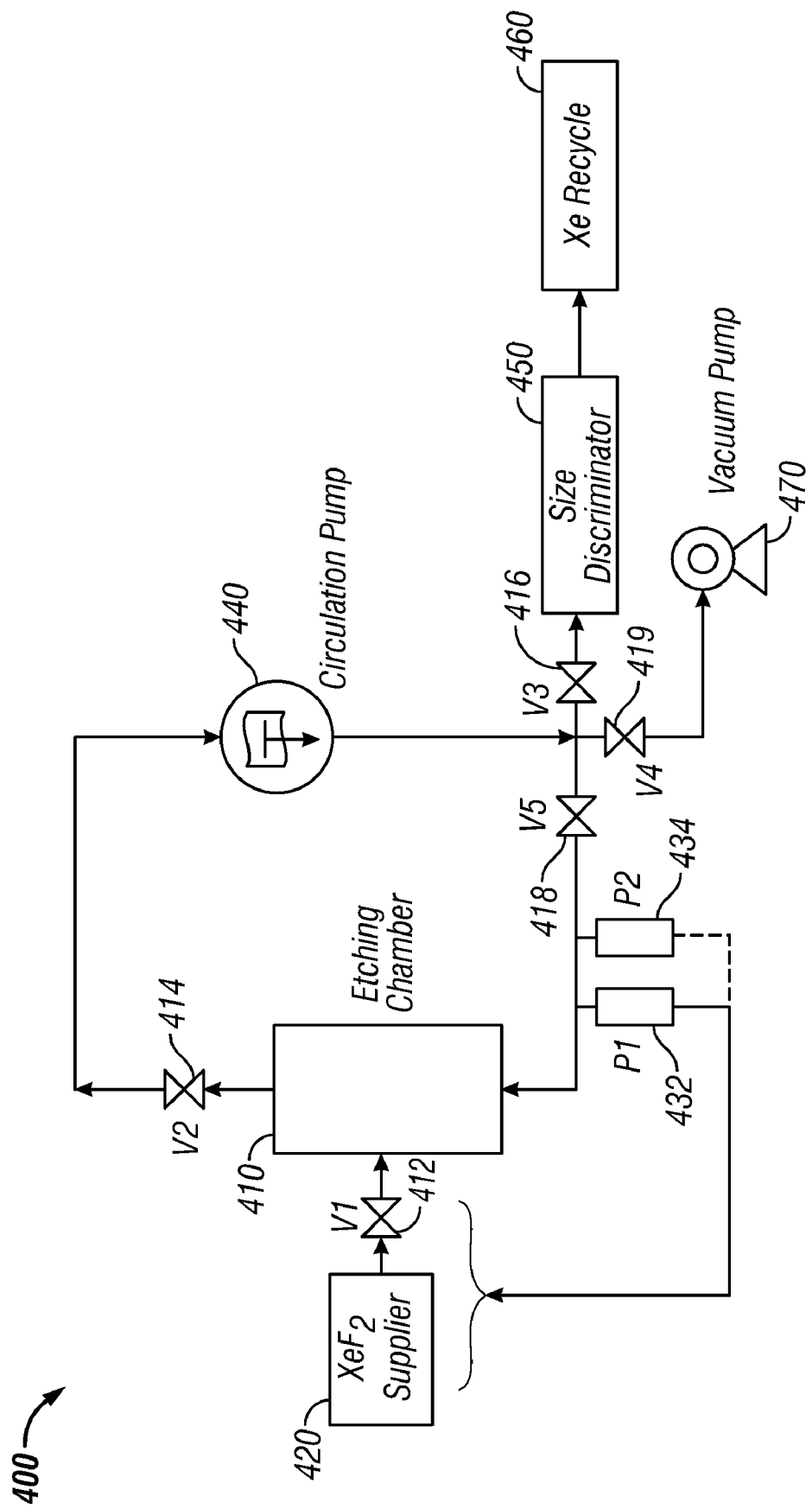
FIG. 15 is a schematic diagram of an etching system comprising a byproduct remover.

In another embodiment, the partial pressure of the byproduct may be reduced, and the partial pressure of the etchant maintained or the reduction minimized. FIG. 15 illustrates a system 400 which is configured to achieve this result utilizing certain techniques previously discussed. This system includes an etching chamber 410, which is separated from a $XeF_2$ supplier 420 via a valve 412 which controls the rate of flow of $XeF_2$ into the etching chamber 410. One or more sensors to monitor the state of the etching chamber 410 may be provided. In the illustrated embodiment, the system 400 comprises a sensor 432 configured to monitor the total pressure and a sensor 434 configured to monitor the $XeF_2$ pressure, permitting a determination of the partial pressure of the $XeF_2$ at any given point during the etching process. A circulation pump 440 is separated from the etching chamber via a valve 414, and is configured to push process gases through a valve 416 towards a byproduct remover 450, which in certain embodiments is a size discriminator that may separate the $XeF_2$ from the remainder of the materials based upon the size of the $XeF_2$ molecule. Thus, the byproduct remover 450 may comprise, for example, a permeable membrane or a size-selective absorber or adsorber. A Xe separation apparatus 460 may be provided, so as to generate elemental Xe from the etching byproducts. When necessary, a valve 419 may be opened and a vacuum pump 470 used to remove the process gases from the etching chamber. The separated $XeF_2$ may then be permitted to flow back into the etching chamber. In certain embodiments, the valves may be two-way valves.

Thus, in one embodiment, the circulation pump 440 drives process gases towards the byproduct remover 450 during the etching process. The etching byproducts are removed during the etching via the byproduct remover 450, so as to reduce the partial pressure of the byproducts. By circulating the separated $XeF_2$ back into the etching chamber 410, the rate of decrease of the $XeF_2$ partial pressure can be slowed. Where necessary or desired, the sensors 432 and 434 which monitor the $XeF_2$ partial pressure can be used to provide an indication of how long valve 412 should be opened in order to release additional $XeF_2$, so as to maintain the partial pressure of $XeF_2$ at a desired location.

In another embodiment, a valve 418 may be provided between the byproduct remover 450 and the etch chamber 410 so as to permit operation in a pulse etching mode, wherein valves 414 and 416 are periodically opened to permit process gases to flow towards the byproduct remover 450, and then valve 418 is opened to permit the purified $XeF_2$ to flow into the etch chamber 410. The circulation pump 440 may be used in both steps to facilitate gas flow.

In another embodiment, a variable volume chamber may be used in a pulse etching process to increase the rate constant of the etching process. The etching of a molybdenum layer using $XeF_2$ has been shown to be a first order reaction. Namely, the etch reaction rate at a given temperature for a given workpiece (assuming the exposed Mo surface area is constant) is as follows:

$$\text{Rate} = k \cdot P_{XeF2}{}^n,$$

where k is the reaction rate constant, and $F_{XeF2}$ is the partial pressure of the $XeF_2$ in the process chamber. When the etching takes place in a closed vessel, the relative consumption rate of $XeF_2$ due to etching Mo is independent of the initial partial pressure of $XeF_2$ in the process chamber. This relative consumption rate can be expressed in terms of the half time of $XeF_2$ within the chamber (the time to consume 50% of the total $XeF_2$ within the chamber), wherein the half time is given by:

$$t_{1/2} = \ln(2/k).$$

The half time of the etchant thus determines the usage efficiency of the etching process. For a given process, a dwell time of $2t_{1/2}$ will result in a usage efficiency of 75%, and a dwell time of $4t_{1/2}$ will result in a usage efficiency of 94%. Thus, by doubling the dwell time to four times the half time, the usage efficiency of $XeF_2$ increases by almost 20%, but at the cost of a decrease in throughput.

A series of shorter dwell times used in a pulse etching process provides greater etching at the cost of a lower usage efficiency for the $XeF_2$ etchant. Thus, in one embodiment, a series of three $XeF_2$ pulse etch cycles may be used, wherein $XeF_2$ at 1 Torr partial pressure is introduced into an etching chamber for dwell periods of 30 seconds each, followed by a pump-out purge between cycles.

Figure 16:
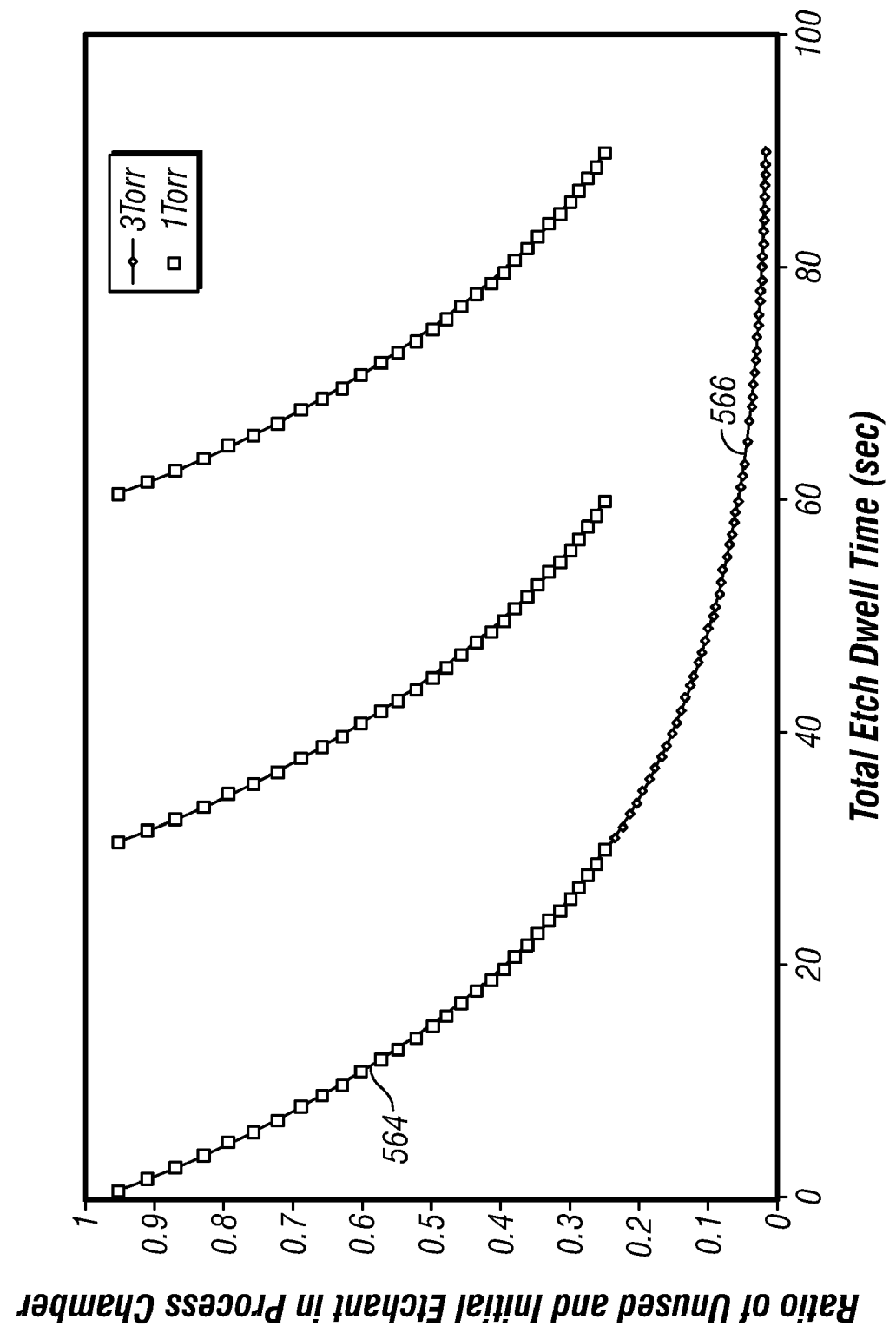
FIG. 16 is a plot of the ration of unused $XeF_2$ to initial $XeF_2$ as a function of dwell time for two different etching processes.

In an embodiment in which the half time of $XeF_2$ during this etching process is about 15 seconds, the ratio of unused $XeF_2$ to initial $XeF_2$ within the process chamber as a function of the total etch dwell time is shown in FIG. 16. It can be seen the ratio 554 of unused to initial $XeF_2$ for this process decreases to about 0.25 at the end of each cycle. 75% of the total $XeF_2$ is thus used in this process. The remainder can be recovered and/or recycled as discussed above.

As noted above, the relative rate of $XeF_2$ consumption is independent of the initial partial pressure of the $XeF_2$. By increasing the initial partial pressure of the $XeF_2$, the half time will remain constant and the etch rate of the Mo will increase. In another embodiment, the three cycle etch described above may be replaced with a single cycle, with an initial partial pressure of 3 Torr and a dwell time of about 90 seconds. As the relative consumption rate of the etchant is independent of the initial partial pressure, the plot 566 of the ratio of unused XeF$_2$ to initial XeF$_2$ as a function of time parallels the plot 564 of the same ratio from the previously discussed pulse etching process for the first thirty seconds of the dwell time, and then continues downward, such that roughly 99% of the XeF$_2$ is used by the end of the 90 second dwell time.

As the same total amount of XeF$_2$ was introduced in the single etch cycle at 3 Torr as was introduced by the combination of the three etch cycles at 1 Torr, it can be seen that the efficiency has been significantly increased by the introduction of XeF$_2$ at a higher partial pressure. Although described with respect to a single extended etch cycle, it will be understood that multiple cycles at higher XeF$_2$ partial pressures may be used in succession in an etching process where an increase in throughput at the expense of etching efficiency may be desirable.

Figure 17:
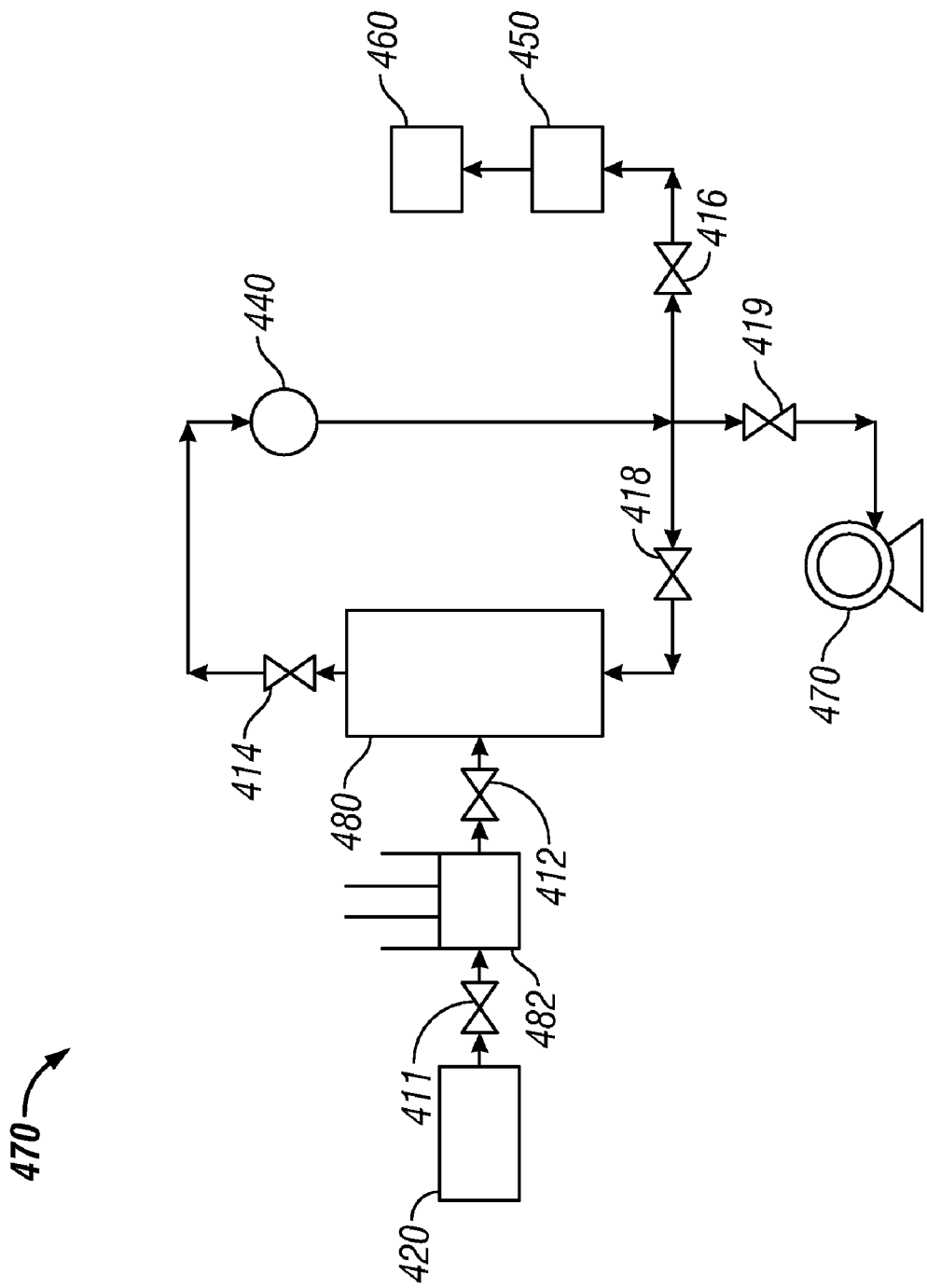
FIG. 17 is a schematic diagram of an etching system which is configured to increase the initial partial pressure of an etchant within a process chamber.

FIG. 17 illustrates an embodiment of a system 470 which is configured to introduce an etchant into a process chamber 480 at an increased partial pressure. The system 470 is similar to the system 400 of FIG. 15, but differs in two significant respects. Because the system 470 need not constantly maintain the partial pressure of etchants within the processing chamber 470, the sensors 432 and 434 of system 400 need not be included in system 470, although sensors to monitor the partial pressure of the system 470 may be included if desired. The system 470 also includes an expansion chamber 482 located between the XeF$_2$ source 420 and the processing chamber 480. The expansion chamber 482 may comprise a mechanism for varying the volume of the expansion chamber 482 in order to increase the pressure of the XeF$_2$. In another embodiment, the processing chamber 480 may include a mechanism for varying the volume of the processing chamber 480 as well, and in particular embodiments no expansion chamber 482 may be necessary when the processing chamber 480 has a variable volume.

In an embodiment in which the system 470 comprises an expansion chamber 482 with a varying volume, an etching process may proceed as follows. Valve 411 is opened to permit XeF$_2$ to flow from the XeF$_2$ storage chamber 420 into the expansion chamber 482. The XeF$_2$ in the expansion chamber 482 may then be compressed to increase the pressure of the XeF$_2$ within the expansion chamber 482. Valve 412 may then be opened to allow the pressurized XeF$_2$ to flow from expansion chamber 482 into the process chamber 480. Because pressurized XeF$_2$ is flowing into the process chamber 480, the partial pressure of XeF$_2$ within the process chamber 480 will be increased, and the amount of sacrificial material consumed per unit time will be increased accordingly, as the relative rate of consumption will remain constant with a larger initial amount of etchant within the chamber.

If multiple cycles are to be used, a circulation pump 440 may be used to draw process gases out of the process chamber 480 between cycles, as discussed above. Similarly, as discussed above, a size discriminator 450 and a Xe recycler 460 may be used to recycle Xe remaining within the chamber 480 at the end of an etch cycle. In addition, when multiple cycles are used, the time between cycles may be reduced by introducing additional XeF$_2$ into the expansion chamber 482 during the dwell time of the previous cycle. By compressing the XeF$_2$ in the expansion chamber 482 at or during this time, pressurized XeF$_2$ may be ready for release into the process chamber immediately upon completion of the pump-out process at the end of the previous etch cycle.

In other embodiments, the volume of the process chamber 480 may be reduced once the XeF$_2$ is introduced to increase the partial pressure of the etchant. This may be done either in place of or subsequent to compression of the etchant in the expansion chamber 482.

In further embodiments, the XeF$_2$ may be maintained at a higher temperature before introduction into the process chamber 480, while the expansion chamber 482 is kept at the normal process temperature. The pressure within the process chamber 480 is dependent upon the volume of the expansion chamber 482 and the volume ratio between the expansion chamber 482 and the process chamber 480. The pressure within the expansion chamber 482 can be controlled by controlling the minimum temperature in the XeF$_2$ storage area 420, the expansion chamber 482, and the gas manifold. The higher this minimum temperature, the higher the possible pressure within the expansion chamber 482. So long as the pressure within the process chamber 480 is kept below the XeF$_2$ vapor pressure at the process temperature, condensation of the XeF$_2$ etchant can be avoided.

For example, in a particular embodiment wherein the volume ratio between the process chamber 480 and the expansion chamber 482 at the point of gas release is 1:1, XeF$_2$ at a temperature of 50° C. and a pressure of 23 Torr can be released into the process chamber 480 kept at 30° C. and will result in a XeF$_2$ vapor pressure of about 8 Torr within the process chamber 480. The specific temperatures and pressures used may depend on a variety of design considerations, included but not limited to the desired throughput rate for the manufacturing process, the desired process temperature, and the structure to be etched.

In another embodiment, the rate constant k may be increased in order to increase the etching rate. In general, the rate constant k is defined by the Arrhenius equation:

$$k = f \cdot e^{-\frac{E_a}{RT}}$$

where k is the rate constant, f is the pre-exponential factor, Ea is the activation energy, R is the universal gas constant, T is the absolute temperature. For a particular reaction, f and Ea are constant. Increasing the temperature at which the etching process is performed will increase the etching rate. However, the effectiveness of increasing the temperature depends in large part upon the activation energy. The device being fabricated may also limit the temperature at which the etching process may be performed.

It will also be understood that the rate constant may be varied by altering the etching process. This may be done by altering the etchant or sacrificial material, or by the addition of a co-etchant. In one embodiment, oxygen is used in addition to XeF$_2$ to etch a molybdenum sacrificial layer, where the reaction is given by:

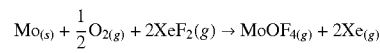

The XeF$_2$ may also react directly with the Mo to form MoF$_6$. As the MoF$_6$ may then react with oxygen to form additional MoOF$_4$, the MoOF$_4$ may be the primary eventual byproduct. As MoOF$_4$ has a lower vapor pressure than XeF$_2$, the process gases may be passed through a cold trap to condense the MoOF$_4$ and recirculate the separated XeF$_2$ back into the etch chamber.

Figure 18:
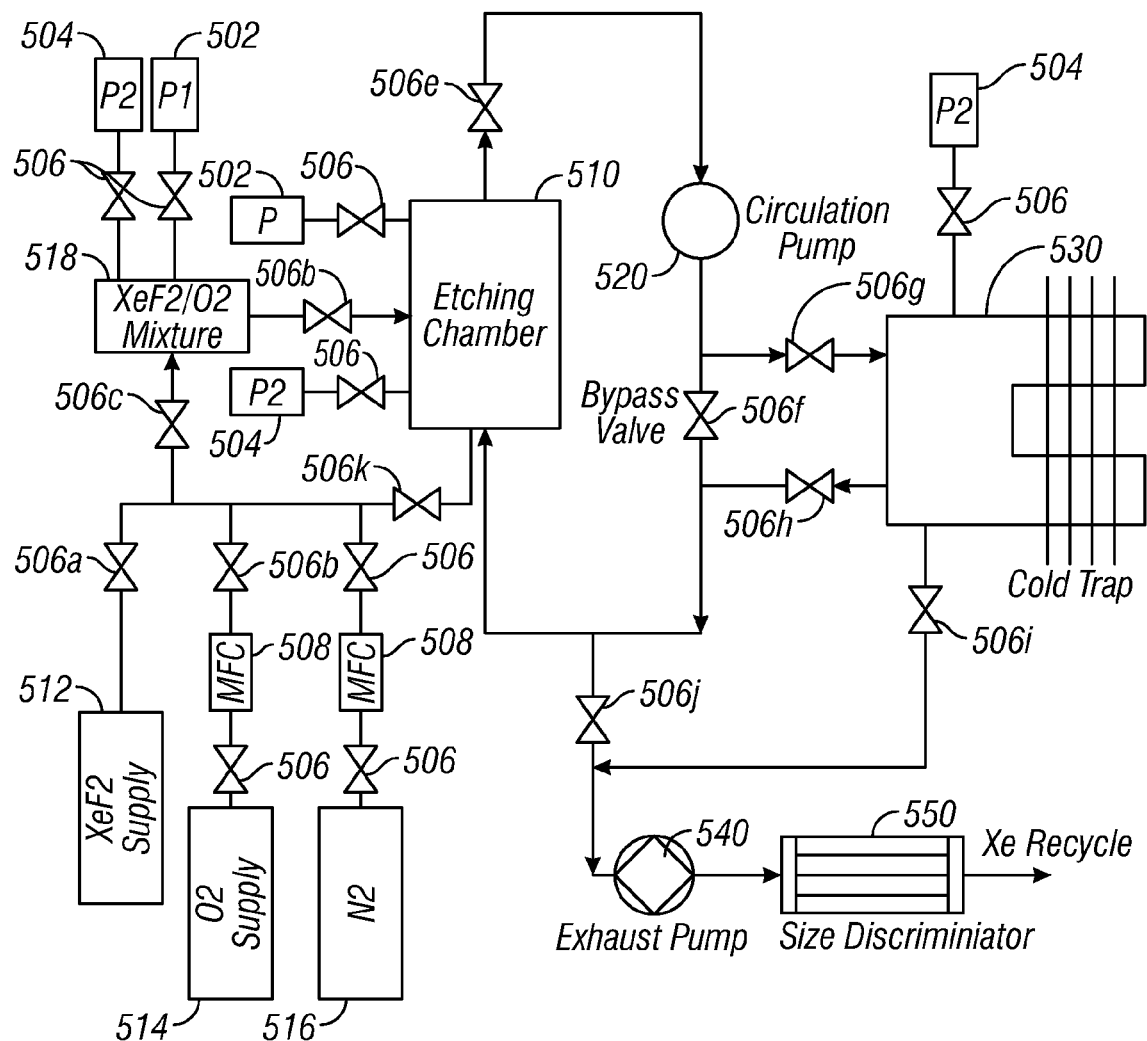
FIG. 18 is a schematic diagram of an etching system comprising a cold trap.

FIG. 18 illustrates an exemplary system 500 which may be configured for use with the XeF$_2$ and O$_2$ etching process described above. The system includes valves 506 located throughout the system (specific valves are identified herein by a particular suffix). The system also includes pressure sensors 502 and 504, which in the illustrated embodiment comprise 100 Torr manometers and 1000 Torr manometers, respectively, although other pressure sensors may be used. A XeF$_2$ storage chamber 512 and an O$_2$ storage chamber 514 are used to store the etchants, and a purge gas chamber 516 may also be provided, and may contain, for example, nitrogen. Control of the XeF$_2$ flow may be provided via a valve 506a and control of the O$_2$ flow may be provided via, inter alias a valve 506b. Mass flow controllers 508 may also be utilized to provide additional control over gas flow, as well.

Although any of the gases may be dispensed directly into the etching chamber 510 via a valve 506k, the XeF$_2$ and O$_2$ may be mixed and stored in a separate etchant mixing chamber 518, wherein the composition of the mixture may be controlled, and the pressure monitored via the pressure sensors in communication with the mixing chamber. A valve 506d may be used to dispense the etchant mixture into the etching chamber 510. When necessary, a valve 506e may be opened, and process gases may be pulled from the etch chamber 510 via circulation pump 520. When desired, a bypass valve 506f may be closed, and cold trap inlet valve 506g and exit valve 506h may be opened, directing fluid flow through the cold trap 530. The cold trap 530 will thus collect condensed MoOF$_4$ as the process gases flow through the cold trap. The unused XeF$_2$ may be then routed back into the etching chamber. The components of the system other than the cold trap may in some embodiments be maintained at an elevated temperature so as to prevent the collection of residue.

It may become necessary to remove excess MoOF$_4$ from the cold trap 530 after prolonged operation. In such a case, the cold trap inlet and exit valves 506g and 506h may be closed, the cold trap warmed to a temperature sufficient to permit vaporization of the MoOF$_4$, a valve 506i may be opened, and the vaporized MoOF$_4$ pulled out via exhaust pump 540. A size discriminator 550 may be provided downstream of the exhaust pump, and may be used in conjunction with a xenon recycling process to isolate or remove desired species. The exhaust pump may also be used, when a valve 506j is open, to remove the gas from the etching chamber, such as in conjunction with the release of purge gas.

Thus, the system 500 can reduce the partial pressure of byproducts such as MoOF$_4$, while the XeF$_2$ and O$_2$ mixture is continuously pumped into the etch chamber 510 (and isolated unused etchant is recirculated into the etch chamber 510) in order to maintain a desired partial pressure of the etchant. It will also be understood that portions of the system 500 may be used in conjunction with other devices and processes disclosed herein, and that portions of the system 500 may be replaced, rearranged, or removed entirely, as appropriate.

In another embodiment, alternate sacrificial materials or structures may be used. In certain embodiments, the etching rate may be increased by utilizing a sacrificial layer other than Mo, Si, or Ge. In particular, the use of a material having a higher molar volume (e.g., a lighter material) will reduce the amount of material needed to fill in a given volume, reducing the amount of etchant utilized to remove a given volume of sacrificial material. In addition, where multiple step reactions are utilized to etch sacrificial material, the use of the intermediate products of these reactions as sacrificial material may reduce the amount of etchant utilized to etch the sacrificial material, and may also increase the speed of the etching process.

As noted above, when XeF$_2$ is used to etch Mo as the sacrificial material, the stoichiometric chemistry is as follows:

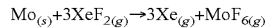

If, instead, an intermediate of the above reaction, such as molybdenum subfluoride, is used as the starting sacrificial material, the stoichiometric chemistry for the release process is now as follows:

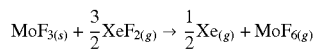

Thus, it can be seen that 50% less XeF$_2$ etchant is utilized to release a given molar volume of MoF$_3$, in comparison to the amount utilized to release a given molar volume of just molybdenum. However, it will also be understood that the higher volume of MoF$_3$ (32.96 cm$^3$/mol in contrast to 9.53 cm$^3$/mol for Mo), will reduce the amount of MoF$_3$ deposited to fill a given space. For example, it will take 0.03 moles of MoF$_3$ to fill a cubic centimeter of space, in comparison to the 0.105 moles needed for Mo. The amount of XeF$_2$ utilized to remove one cubic centimeter of MoF$_3$ is 0.045 moles, as compared to the 0.315 moles utilized to remove the same volume of Mo. Thus, by using MoF$_3$ in place of Mo, the amount of XeF$_2$ utilized to etch the sacrificial layer can be reduced to roughly 14% of what would be utilized to etch Mo.

The etching of a sacrificial layer such as the partially fluorinated MoF$_3$ may take place faster than the etching of only Mo. Such accelerated etching has been observed in partially oxidized Mo layers, such as the exposed portions of a Mo sacrificial layer adjacent to etch holes or other apertures which expose the Mo layer.

It will be understood that a wide variety of intermediate products and other Mo-, Si-, W-, and/or Ge-containing materials used as sacrificial materials may provide a similar reduction in the amount of utilized etchant. Table 1 is a non-limiting list of examples of such materials, along with their molar volume, XeF$_2$ stoichiometry, melting point, and their ratio of XeF$_2$ usage to that of Mo for a given volume of material.

TABLE 1

| Materials | Molar volume (cm3/mol) | XeF$_2$ stoichiometry | Melting Point (C.) | XeF$_2$ usage vs. Mo |
|---|---|---|---|---|
| Mo | 9.53 | 3 | 2622 | 1 |
| Si | 12.06 | 2 | 1414 | 0.527 |
| W | 9.42 | 3 | 3414 | 1.01 |
| Ge | 13.63 | 2 | 938.25 | 0.466 |
| MoF$_3$ | 32.96 | 1.5 | >600 | 0.1451 |
| MoF$_5$ | 54.55 | 0.5 | 67 | 0.029 |
| MoF$_4$ | Unknown | 1 | Unknown | Unknown |
| MoN | 11.95 | 3 | 1750 | 0.797 |
| MoSi$_2$ | 24.53 | 7 | 1900 | 0.9067 |
| *MoO$_2$ | 19.77 | 2 | 1100 | 0.321 |
| *MoO$_3$ | 30.63 | 2 | 860 | 0.207 |
| MoCl$_3$ | 54.09 | 3 | 1027 | 0.176 |
| WN$_2$ | 27.51 | 3 | 600 | 0.346 |
| WCl$_4$ | 70.49 | 3 | 450 | 0.135 |
| *WO$_2$ | 19.99 | 3 | 1500 | 0.477 |
| WF$_4$ | unknown | 1 | 800 | unknown |
| *SiO | 20.22 | 2 | >1200 | 0.314 |
| Si$_3$N$_4$ | 44.25 | 6 | 1900 | 0.431 |
| GeF$_2$ | 30.39 | 1 | 110 | 0.105 |

The XeF$_2$ stoichiometry shown in Table 1 assumes that the final byproducts are full fluorides for the sub-fluorides listed, full fluorides and oxyfluorides for the sub-oxides, full fluorides and molecular nitrogen for sub-nitrides, and full fluorides and molecular chlorine for sub-chlorines. It will be understood that in various embodiments and process conditions, the actual etching reactions may vary. Furthermore, the volumes are listed on the basis of bulk material data, and the molar values of thin films and porous materials may change significantly. For $MoO_2$, $MoO_3$, $WO_2$ and SiO, the stoichiometric chemistry given in the above table is based upon certain assumptions. Although not listed, non-stoichiometric materials may also be used.

It will be understood by those skilled in the art that various physical properties described herein (such as boiling point) may be adjusted by modifying the conditions (such as pressure) under which they are determined. Thus, in view of the guidance provided herein, the descriptions of particular physical properties (such as boiling points and separation conditions at a given pressure) herein will be understood as descriptions of the corresponding physical properties under other conditions (such as the corresponding boiling points at other pressures).

It will be appreciated that Xe and $XeF_2$ recovered from a particular etching process in any of the manners described herein need not be absolutely purified in order to be useful for recycling and re-use in other process, such as in subsequent etching processes (i.e., the reused etching gas may include significant concentrations of impurities and still be useful for etching). For example, for releasing a Si sacrificial layer, recycling as little as 4% by volume of $XeF_2$ can still act as a commercially viable etchant. An embodiment provides a recovered Xe product that has been sufficiently purified by the methods described herein to render it useful for subsequent reaction with $F_2$ to form a $XeF_2$-containing etching gas that is sufficiently free of deleterious impurities so as to be useful for subsequent etching processes to make, for example, MEMS devices as described herein. Another embodiment provides a recovered $XeF_2$ product that has been sufficiently purified by the methods described herein so that is sufficiently free of deleterious impurities so as to be useful for subsequent etching processes to make, for example, MEMS devices as described herein.

In addition to $XeF_2$, a wide variety of other etchants may be used to etch sacrificial layers. Depending on the embodiment, in certain applications, some of these etchants may not react with the sacrificial layer at a sufficient rate, and may be used in conjunction with a chemical or physical excitation process, as noted below. In addition, depending on the particular materials and structures used, certain of these etchants may be used in conjunction with etch barrier layers to protect layers which could otherwise be damaged by the etchants.

Some suitable alternative etchants are fluorine-based. For example, some oxygen fluorides and derivatives which may be suitable include, but are not limited to, $F_2O$, $F_2O_2$, $F_2O_4$, FONO, and $FONO_2$. Some halogen fluorides and derivatives which may be suitable include, but are not limited to, ClF, BrF, $ClF_3$, $ClF_5$, $ClO_2$, OClF, $O_2ClF$, $O_3ClF$, $BrF_3$, $BrF_5$, $IF_3$, $IF_7$, $ClIF_4$, and NCF. When using certain halogen fluorides as release etchants, an etch barrier layer may be used as discussed above, particularly to protect aluminum layers. In addition, $BrF_3$ may be refluorinated with fluorine and recycled for reuse, if desired, in a manner similar to certain of the methods discussed above. Some nitrogen fluorides and derivatives which may be suitable include, but are not limited to, $NF_3$, $N_2F_4$, ONF, $O_3NF$, $C(NF_2)_4$, $(CH_3)_2C(NF_2)_2$, 1,1-difluoroamino, fluorinatated cyclohexane, 1,1,4,4-tetradifluoroamino, $F_2C(NF_2)_2$ and $FC(NF_2)_3$. In addition, other materials may be suitable, as well, including but not limited to $SF_6$, FOOF, $NF_3$ and $NH_3$.

In certain embodiments, etchants having chemical properties similar to those of $XeF_2$ may be used in etching processes. In particular embodiments, $OF_2$ and its derivatives—including but not limited to FOOF, $CF_3OF$, $C_2F_5OF$, $SF_5OF$, and others—may be used as isotropic etchants, and in specific embodiments may be used to etch sacrificial layers such as Si and Mo, although other materials such as Ge, W. and V may also be etched. The materials to be etched may be reacted with $OF_2$ and its derivatives to form volatiles. As will be discussed in greater detail below, the etchants may be excited in a variety of ways to cause or accelerate the etching processes.

$XeF_2$ is a linear molecule which is thermally stable at temperatures as high as 500° C. It has a first dissociation energy of roughly 250 kJ/mole, significantly higher than the $F_2$ dissociation energy of roughly 160 kJ/mole. The second dissociation energy of $XeF_2$, from an XeF radical to elemental Xe and a F radical, is roughly 15 kJ/mole. Similarly, the first dissociation energy of $OF_2$, from $OF_2$ to OF and F radicals, is close to that of $XeF_2$, also at roughly 250 kJ/mole. The second dissociation energy of $OF_2$, splitting the OF free radical into O and F, is less than the first dissociation energy, at roughly 160 kJ/mole.

By replacing one of the F atoms in the $OF_2$ molecule with a substitute, the properties of the molecule may be modified to provide a molecule having a desired property. For example, $XeF_2$ has a molecular weight of 170 amu. By replacing one of the F atoms with $SF_5$, forming $SF_5OF$, a molecule having a molecular weight of 162 amu, close to that of $XeF_2$. If a molecule having a lower first dissociation energy is needed, one of the F atoms may be replaced with $CF_3$ to form $CF_3OF$, which has a first dissociation energy of roughly 180 kJ/mole, less than that of $OF_2$.

In certain embodiments, $OF_2$ derivatives such as $C_2F_5OF$ and $FOC_2F_4OF$ may comprise both OF and fluorocarbon groups. Such molecules may function not only as sacrificial etchants, but also as fluorocarbon deposition precursors. In certain embodiments, when an electronic device being etched comprises a MEMS device such as interferometric modulators, the deposited fluorocarbons which result from the use of these materials as etchants may serve as an anti-stiction layer which prevents undesirable or permanent adhesion between two adjacent layers in the MEMS device. The carbon chain length may also be increased through the use of chain growth reactants such as diiodomethane.

In an exemplary embodiment in which $OF_2$ is used to etch Si, the $OF_2$ molecule may undergo various chemical reactions with the Si layer, depending on the dissociation conditions. A possible reaction proceeds as follows:

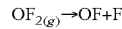

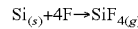

Another possible reaction of OF2 with the Si layer proceeds as follows:

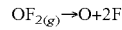

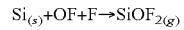

Generally, many chemicals may be physically excited so as to cause dissociation and generate a chemically active species, or may be physically excited so as to cause a chemical in an inert state to be excited to a chemically active excited state. Such chemicals may be referred to as etchant precursors.

UV activation of $F_2$ discussed above is one such example of UV dissociation of materials. In another example, $SF_6$ may be used in a downstream plasma etching process so as to isotropically etch a Si sacrificial layer. Because many of such active species may be unstable (or metastable), the chemically active species may in certain embodiments be generated in close proximite to the sacrificial material to be etched. In other embodiments, active species having sufficiently long lifetimes for a desired application may be selected.

Various methods of physical excitation may be utilized, such as plasma (RF or discharge), exposure to UV light and other high energy radiation such as X-rays or gamma radiation, laser activation, high temperatures, microwave heating, and high energy ion incidence. In certain embodiments, etchant precursors may be activated only through thermal energy. $OF_2$ will begin to decompose at a temperature of between 250 and 270° C. However, in order to increase the etch rate of $OF_2$, an F atom can be replaced with a $CF_3$ molecule, forming $CF_3OF$. The first dissociation energy is thus decreased from roughly 250 kj/mol to roughly 180 kJ/mol. At a temperature of 55° C., the dissociation rate is much faster (roughly $10^{11}$ times faster) than that of $OF_2$.

Another $OF_2$ derivative having similar properties to that of $XeF_2$ is FO—$CF_2$—$CF_2$—OF, 1,1,2,2-tetrafluoroethyl 1,2-dihypofluorite. This compound has a molecular weight of 170 amu, the same as $XeF_2$, and is expected to have a similar first dissolution energy (roughly 180 kj/mol), from $FOC_2F_4OF$ to an F radical and $FOC_2F_4O$. Similarly, the second dissolution energy, from $FOC_2F_4O$ to an F free radical and $OC_2F_4O$ is expected to be similar to that of $XeF_2$, as the free radical is highly energetic.

By heating such an etchant or etchant precursor to a level sufficient to cause dissociation, the etch rate may be increased to a desired level. As an increased temperature may alter the etch selectivity of the etchant, it may be necessary to maintain the temperature below a particular temperature. In one embodiment, the etchant or etchant precursor is heated to a temperature of less than 300° C. In one embodiment, the etchant or etchant precursor is heated to a temperature of greater than 250° C. The specific temperature used may vary based at least in part on the specific etchant or etchant precursor, the other materials being used in the electronic device to be etched, and the desired dissociation rate and/or etch time.

For MEMS devices wherein layers underlying the sacrificial layer are at least partially light-transmissive, exposure to UV or other radiation may be done by exposure through these light-transmissive layers. In certain embodiments, the sacrificial layer or other layer to be etched may itself comprise a light-transmissive material, such as $Si_xN_y$ (e.g., deposited by PECVD).

In certain embodiments, $F_2$ may be used to etch Si when excited by UV radiation to form an activated etching species in the form of a F free radical according to the following reaction, referred to as photolysis or photodissociation:

$$F_2 \longrightarrow \cdot F + \cdot F$$

These F free radicals may be produced from $F_2$ at low pressure, e.g., up to 1-2 Torr in 20 Torr Ar, by the use of microwave heating in a sapphire tube, exposure to UV light, laser activation, or by placement in a furnace at a sufficiently high temperature, such as between 300 and 600° C. In an embodiment, the $F_2$ may be photodissociated by UV light having a wavelength of about 290 nm, although other wavelengths of UV light may also be used.

Because of its low dissociation energy, $F_2$ can be dissociated into F free radicals having a lifetime of several minutes, although the lifetime will be dependent at least in part upon the partial pressure of the F free radical in an inert gas. These F free radicals are not highly corrosive to most alloys, and can thus be piped via copper or stainless steel piping.

These F free radicals are substantially non-reactive to materials such as $SiO_2$ and $Al_2O_3$, and can thus be used to selectively etch sacrificial layers such as Si or Mo relative to adjacent $SiO_2$ or $Al_2O_3$ layers. Furthermore, the reaction rate between the F free radicals and Mo (to form $MoF_6$) or Si (to form $SiF_4$) gases is relatively high, such that in most embodiments the photolysis rate of the $F_2$ will control the etching rate. The photolysis rate may be dependent upon the light intensity, the photon cross-section of $F_2$, and the quantum yield of the dissociation reaction. In a particular embodiment the etchant comprises $F_2$ at 400 Torr and a temperature of 55° C. exposed to UV light with a wavelength of 290 nm and at an intensity of 5 W/cm². In such an embodiment, Mo will be etched by the F free radicals at a rate of about 130 nm/sec (8 μm/sec).

Figure 19:
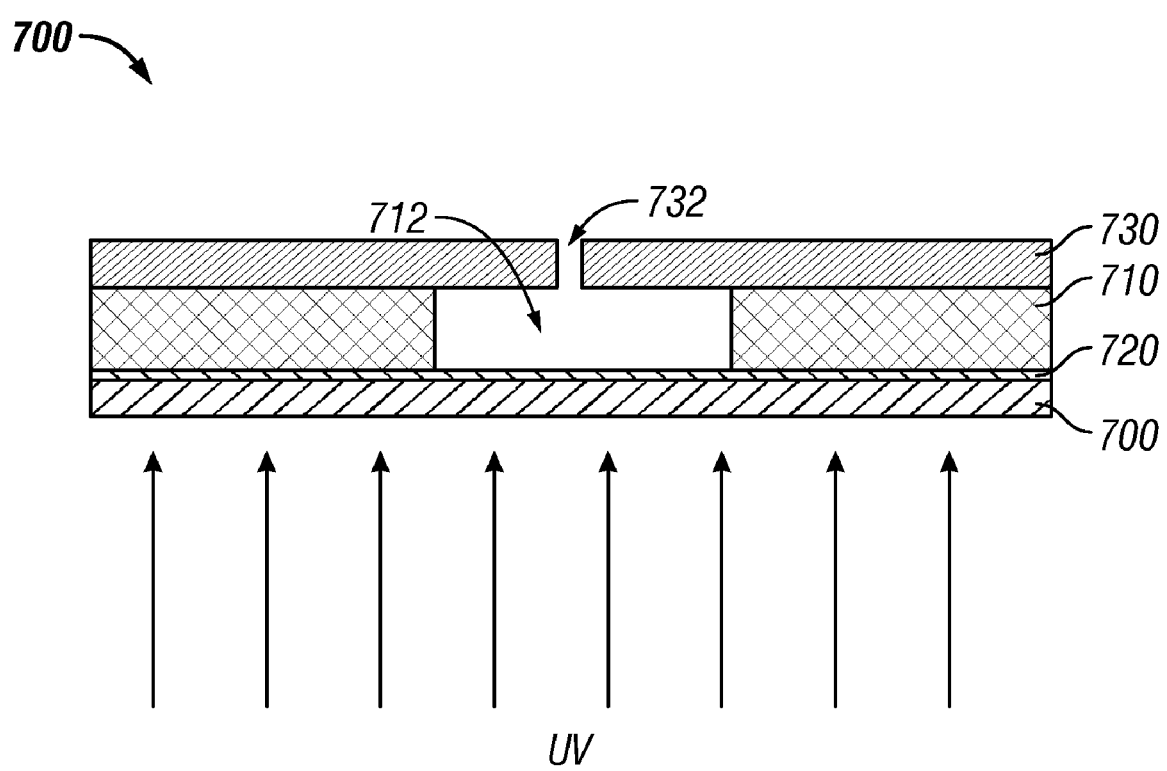
FIG. 19 is a cross-sectional schematic illustration of a stage in a process for fabricating a MEMS device wherein UV light is used to physically excite an etchant precursor.

In the embodiment depicted in FIG. 19, a sacrificial layer 710 has been deposited over a substrate 700 which is at least partially transmissive to light, and in particular may be at least partially transmissive to UV light. In certain embodiments, such as the illustrated embodiment, the sacrificial layer 710 has been deposited over an optical stack 720 located on the substrate, wherein the optical stack is also least partially transmissive to UV light. A mechanical layer 730 has been deposited over the sacrificial layer, and an etch hole 732 formed in the mechanical layer to expose a portion of the sacrificial layer. An initial etch has been performed so as to remove a portion 712 of the sacrificial material to expose the underlying optical stack 720. A physically excitable chemical, such as a gaseous chemical, may then be introduced into the etch chamber in which this process is performed. This excitable chemical will enter the removed portion 712 of the sacrificial layer.

The excitable chemical is then exposed to UV radiation through the light-transmissive layers, exciting the chemical to create an active species which interacts with the sacrificial material so as to etch the sacrificial material. Because the excitable chemical will permeate the cavity defined by the removed sacrificial layer, the UV light will continue to generate the active species adjacent the edge of the sacrificial layer as the sacrificial layer is etched. This process thus permits the use of active species which may have short lifetimes and which would otherwise be unable to isotropically diffuse down the length of the cavity to reach portions of the sacrificial layer.

In a particular embodiment, the initial etch may be performed by exposing the exposed sacrificial layer to UV radiation from the opposite side of the movable layer. In certain embodiments, a single UV light source may be used, and the substrate rotated or the light source moved with respect to the substrate once the initial etch has etched through the substrate. In other embodiments, UV light sources on both sides may be used. In an embodiment in which the sacrificial layer comprises a light-transmissive material, only a UV light source on the side of the substrate may be needed. In other embodiments, the initial etch may be performed by another etching method, such as etch subsequent to the formation of etch holes in the movable layer. In certain embodiments this etch may be done using either the same mask as that used to form the etch holes or by using the patterned movable layer itself as a mask.

Under the conditions discussed above (400 Torr $F_2$, 55° C., 290 nm UV light at 5 W/cm² intensity), and assuming an additional 10 μm undercut in a 0.2 μm gap, the undercut etch rate of Mo will be about 65 μm/sec when exposed through Corning 1737 glass. In other embodiments, by varying the above process conditions, the etch rate may be increased or decreased.

A variety of excitable chemicals may be used in such an etching process. For example, $F_2$ may be excited as discussed above. A mixture comprising $F_2$ and $O_2$ may be exposed to UV light to generate FOOF and FOO radicals. It will also be understood that particular excitable chemicals may be used in conjunction with particular sacrificial materials. For example, $SF_6$ and $NF_3$ may be excited and used to etch Si. $NH_3$ may be excited and used to etch $SiO_2$. This excitation may be done via plasma, or via UV radiation in the manner described above, functioning similarly to plasma. UV radiation with a wavelength of 248 nm has photon energy of 5 eV, which is sufficient to break most single bonds. Shorter wavelengths can provide still additional energy. In some embodiments, pulsing IR and/or microwave energy on/off (or amplitude modulating) can "pump" the reactant in and out of the cavity as the sacrificial layer is released. It will also be understood that many of the other fluorides may be excited in a similar manner to that discussed above.

In certain embodiments, homogenous catalysts may be used in conjunction with UV or other types of excitation. In one embodiment, $KrF_2$ (or $Kr+F_2$) may be used as etchants, under conditions in which the etchants are excited, chemically or physically. $KrF_2$ in crystalline form sublimes at 213° K, and at room temperature $KrF_2$ is a gas. $KrF_2$ gas pressures can be obtained which are one or two orders of magnitude greater than for $XeF_2$ gas, which may increase the etch rate of sacrificial material, as discussed above. In addition, $KrF_2$ is significantly less expensive than $XeF_2$. It has a lifetime of many hours, and it may be practical to generate it on-site in a manufacturing line and use in an etching process in a nearby system. Delivery of $KrF_2$ may be done via stainless steel or copper tubing. It may be generated by exposing a mixture of Kr and $F_2$ to UV light with a wavelength in the range of about 250 to about 350 nm.

Once produced, $KrF_2$ may be used in an etching process with or without further purification. $KrF_2$ may also be produced in the same chamber used as the etching chamber, eliminating the need for $KrF_2$ to be piped to the etching chamber. In a particular embodiment, the device to be etched is loaded into the chamber, and Kr and $F_2$ are then released into the chamber. A UV light is then activated in operable proximity to the chamber, and $KrF_2$ is produced. Under certain conditions, $F_2$ may be produced, as well. Both $KrF_2$ and the F radical will begin etching the sacrificial material.

The Kr in the $KrF_2$ molecules will serve as a homogenous catalyst during the fluorination of the sacrificial material, according to the following reaction:

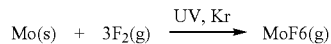

It can be seen that the Kr is not consumed by this fluorination process, and thus, the same amount of Kr will be regenerated from the etching reaction. In addition, the extended lifetime of the $KrF_2$ molecules makes them suitable for use in etching a high-aspect ratio sacrificial layer such as that in an interferometric modulator, where the etchant diffuses down a long path within the cavity being released before reaching portions of the sacrificial material.

Similarly, Xe may be used as a homogenous catalyst in a UV-activated $F_2$ etching process, resulting in in situ $XeF_2$ generation and etching of a layer such as a Si or Mo layer according to the following chemical reactions (described with respect to the etching of a Mo layer):

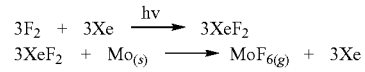

If sufficient Xe is utilized such that Xe is not a limiting reagent of the $XeF_2$ generation reaction, the $XeF_2$ generation rate will be dependent upon the amount of $F_2$ present, the degree to which the material is exposed to UV light (e.g., areal or volumetric exposure rate), and the wavelength and power output of the UV light source. In an embodiment in which the process chamber comprises 400 Torr $F_2$ and a 1000 W UV lamp emitting light with a wavelength of about 290 nm on an area 10 cm×10 cm in size, 1.2 g/min of $XeF_2$ can be generated. If instead $OF_2$ at 400 Torr is used, and the lamp emits light with a wavelength of 248 nm, $XeF_2$ may be generated at a rate of 5.4 g/min.

As described above with respect to the use of Kr, the Xe is utilized as a catalyst, but is not consumed. At the conclusion of the etching process, some or all of the Xe or Kr utilized in the etching process may be recovered using a suitable method, such as the methods discussed above.

Etchants suitable for etching a high-aspect sacrificial or other layer may be particularly suitable for use when the surrounding layers are not significantly transmissive to UV radiation, such as in a non-optical MEMS device comprising two metal or otherwise opaque layers separated by a sacrificial layer during the fabrication process. For example, such an etching process may be suitable for the etching of a sacrificial layer in certain MEMS switches including two adjacent opaque layers separated by the sacrificial layer.

In another embodiment, the use of a noble gas such as Kr or Xe as a homogenous catalyst may be used to maintain an etching process where the initial etchant comprises a noble gas fluoride such as $XeF_2$ or $KrF_2$. In a particular embodiment, an etching process begins by releasing $XeF_2$ into a process chamber. $F_2$ may also be released into the chamber, either along with the $XeF_2$, or at a different time, such as subsequent to the $XeF_2$ release. As elemental Xe may be one of the byproducts of the $XeF_2$ etching process, the process gases within the process chamber may eventually contain elemental Xe, even though it was not released into the process chamber in that form.

The process gases within the process chamber may then be exposed to UV radiation, which will cause the elemental Xe and $F_2$ to form $XeF_2$, as discussed above. The $XeF_2$ will then continue the etching process. A $XeF_2$ process can be maintained in this manner without the introduction of additional $XeF_2$, or with the introduction of less additional $XeF_2$ than would otherwise be necessary. The additional $F_2$ can in certain embodiments be released over time, either continuously or in pulses. In particular embodiments, the $XeF_2$ may be generated by exposing the process gases to UV radiation through a transmissive substrate and/or other transmissive layers, such that the $XeF_2$ may be generated directly at the etch boundary. Although discussed with respect to $XeF_2$, this method may be used with other noble gas fluorides, such as $KrF_2$, to maintain etching processes using those etchants, as well.

UV excitation may also be used in an embodiment of an etching process in which an O—F bond in an $OF_2$ molecule or a derivative thereof is dissociated to form radicals. As noted above, the dissociation conditions may determine the manner in which the $OF_2$ molecule is dissociated. For example, when a photon having a wavelength of about 250 nm or less is used, the $OF_2$ molecule will fully dissociate into O and F radicals in the following reaction:

$$OF_2 \xrightarrow{h\nu} F + F + O$$

If a photon having a wavelength of about 250 nm to 495 nm is used, the $OF_2$ molecule will dissociate in the following manner:

$$OF_2 \xrightarrow{h\nu} F + OF$$

If a photon having a wavelength of about 495 nm to 550 nm is used, the $OF_2$ molecule will dissociate according to the following reaction:

$$OF_2 \xrightarrow{h\nu} F_2 + O$$

The dissociation rate of $OF_2$ is dependent upon, for example, the absorptivity of the $OF_2$ molecule, the intensity of the UV light, and the quantum yield. If one assumes that the quantum yield is substantially constant across the UV spectrum, the dissociation rate is the product of the absorptivity of $OF_2$ to UV light and the transmission of the UV light through any intervening media. In an embodiment in which $OF_2$ adjacent the sacrificial material is exposed to UV light through a light-transmissive substrate, the dominant factor in the transmittance of the UV light is the transmittance of the substrate. In a particular embodiment, the substrate being used is a 0.7 mm-thick Corning 1737 glass substrate.

Figure 20A:
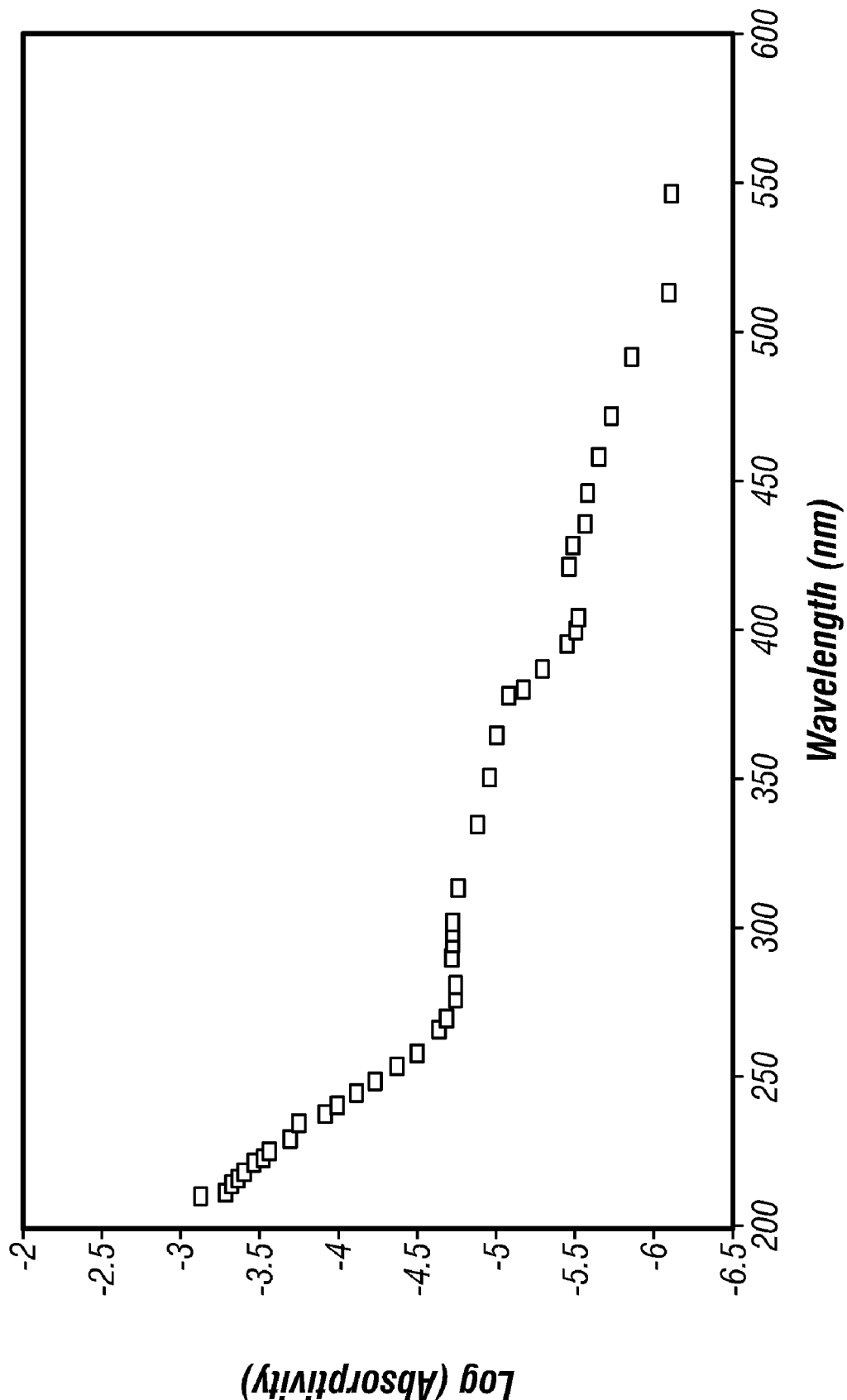
FIG. 20A is a plot of $OF_2$ absorption of UV light as a function of wavelength.
Figure 20B:
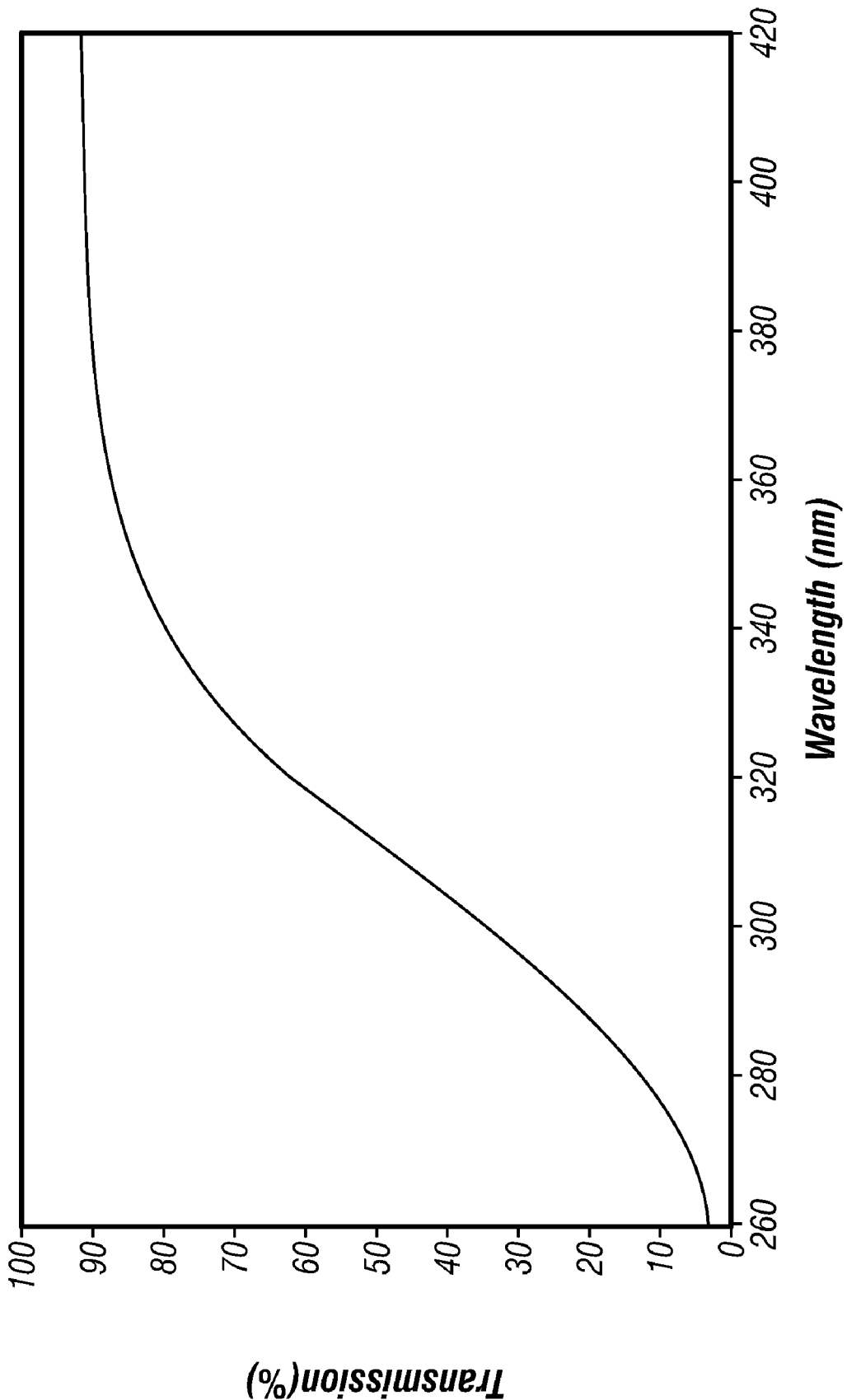
FIG. 20B is a plot of UV transmission of 0.7 mm Corning 1737 glass as a function of wavelength.
Figure 20C:
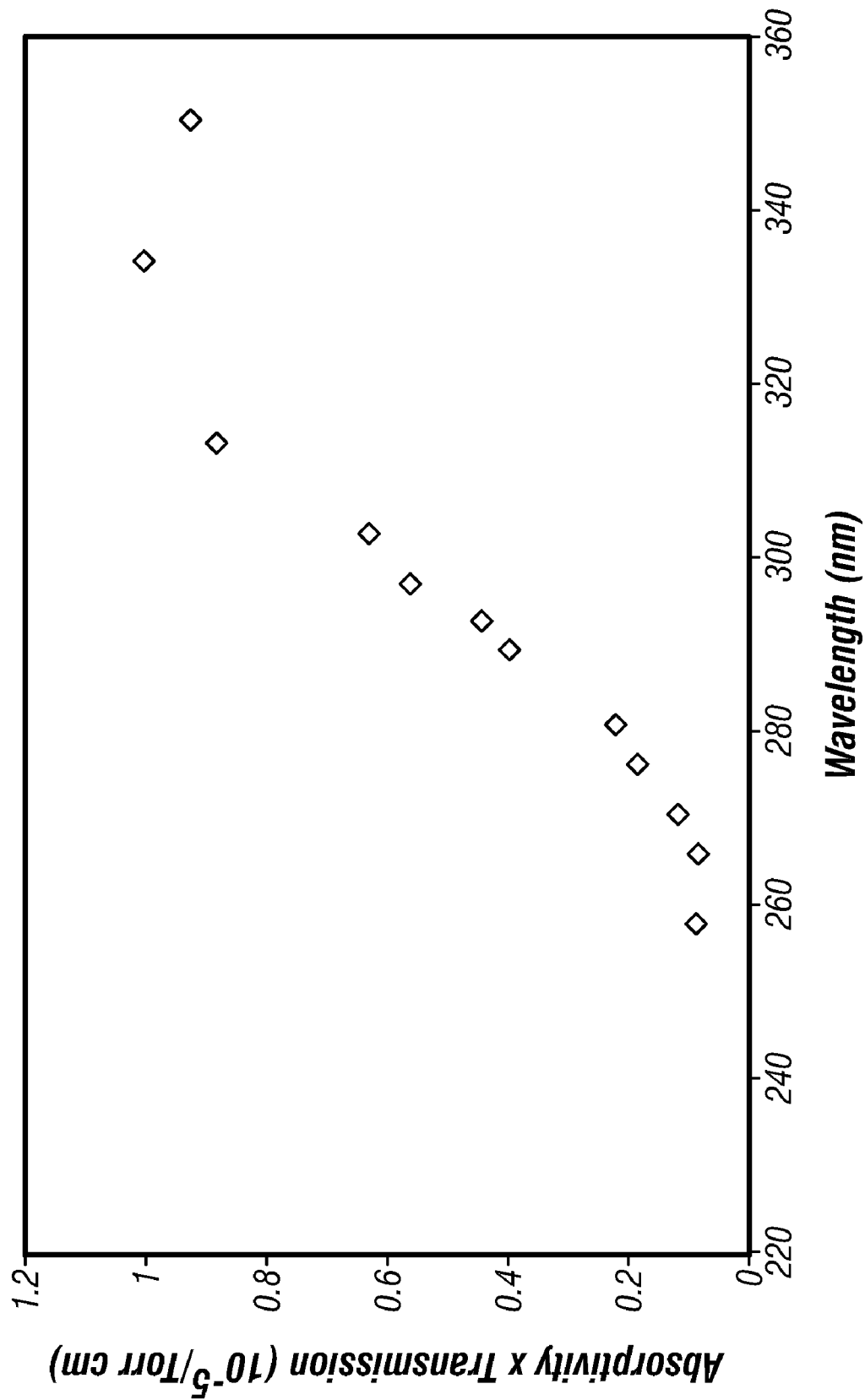
FIG. 20C is a plot of the dissociation rate of $OF_2$ as a function of wavelength.

FIG. 20A is a plot of $OF_2$ absorption of UV light as a function of wavelength. FIG. 20B is a plot of UV transmission of 0.7 mm Corning 1737 glass, as given by the Corning 1737 datasheet. FIG. 20C is a plot of the dissociation rate of $OF_2$ as a function of wavelength of UV light transmitted through such a substrate. It can be seen that the highest rate of dissociation will occur using UV light having a wavelength in the range of about 310 nm to about 350 nm. Exposure to UV light at this wavelength will cause dissociation into O and OF, as noted above. When used to etch a Mo sacrificial layer, an etch byproduct will be $MoF_4$, which is less susceptible to water and less corrosive to silicon than byproducts of some other etching reactions, facilitating the etching of a Mo layer selectively with respect to adjacent layers and also facilitating the handling of the etch byproducts.

Although the above embodiments of UV-excited or UV-photodissociated etchants have been discussed with respect to broad areas of UV exposure, more focused UV exposure may be used to localize etching. Commercially available UV lasers are capable of generating spot beams having a width of less than 1 µm, such as the ESI 9850UV tool, which is capable of producing a 0.8 µm spot size UV beam.

For UV-photodissociated etchants such as $Cl_2$ or $F_2$ photodissociated by a spot UV beam, the Cl or F radicals will be formed substantially only along the beam path. Given appropriate process conditions, Cl or F radicals having a mean free path on the same order of magnitude as a submicron spot size UV beam may be generated. In certain embodiments, this may be done through the inclusion of radical scavengers which prevent the chain propagation and diffusion of radicals. For example, Si can be patterned by UV-enhanced $Cl_2$ etching at 50° C. using $O_2$ at 400 Torr as a radical scavenger. Under such conditions, the mean free path of the Cl radicals generated by photodissociation of the $Cl_2$ molecules will be less than 0.5 µm.

Thus, under appropriate process conditions, the use of a UV laser or other spot UV source may permit maskless etching of materials. As discussed above, the fabrication of a MEMS device such as an interferometric modulator typically comprises multiple patterning steps, which may involve the use of one or more masks. In certain embodiments, spot UV-enhanced patterning may be used to accurately pattern such layers at the resolution desired for MEMS device fabrication.

For example, the interferometric modulator fabrication process discussed above may comprise the patterning of a sacrificial layer to form apertures for support structures. In one embodiment, this is done without the use of a mask by introducing a UV-enhanced etchant and a radical scavenger into a process chamber, and exposing the portions of the sacrificial layer to be etched to UV light via a UV spot light source such as a UV laser. Radicals are generated in the path of the light beam, and the portion of the sacrificial layer exposed to the UV light source will be etched by the generated radicals. In a specific embodiment, a fluorine-based compound which dissociates under UV irradiation can be used to pattern a sacrificial layer comprising Mo or Si, as discussed above. Other sacrificial layers which can be etched in this manner include, but are not limited to, Ge and Ge—Si layers.

Other suitable UV-activated etchants may also be used, and other materials or layers within MEMS devices may also be patterned in this manner. For example, Mo may also be used in an optical stack, and may be etched by $F_2$ under UV irradiation, as discussed above. MoCr layers may be used in optical stacks, and may be etched by $F_2$ under UV-irradiation to form $MoF_6$ and $CrF_5$. Al may be used as a highly reflective layer, such as in a movable reflective sublayer, and may be etched by $Cl_2$ under UV-irradiation to form $Al_2Cl_6$.

When a UV laser is used to excite the etchant, particularly in combination with radical scavengers, there may be no need for a mask or other method of constraining the etch in the lateral direction, as the radicals will exist substantially only in the path of the UV laser beam. However, as the etch will expose underlying layers, an etch stop layer may be provided underneath the layer to be etched, when the underlying layer is susceptible to etching by the generated radicals. In certain embodiments, the etch stop layer may comprise a suitable oxide or nitride. For example, in particular embodiments, materials which may be used as etch stop layers underlying a layer to be etched include, but are not limited to, $SiO_2$, $Si_xN_y$, and $Al_2O_3$.

In other embodiments, chemical excitement may be utilized. In particular embodiments, additional materials may be deposited with or adjacent to the sacrificial layer to serve as a catalyst or reagent in an etching reaction. Chemical excitement may be done for example by radical generation. In some embodiments, a radical initiator from the azo-nitrile family may be used. One example is 2,2-azobis[2-methyl-]-propanenitrile (AZDH). Various molecules in this family can be used to generate free radicals at different temperatures, and these radicals may last for hours. Azonitrile radical initiators may be obtained commercially (e.g., Vazo® family, produced by Dupont). Organic peroxides (e.g., di-tert-butyl peroxide), hyperperoxides (e.g., n-docecyl hyperperoxide), and peresters (e.g., benzperoxoic acid ethyl ester) are other examples of free radical initiators.

In an embodiment in which $OF_2$ dissociation is used to generate radicals which etch a particular material, NO may be introduced along with the $OF_2$ in order to accelerate the dissociation of the $OF_2$. NO is a molecular free radical with an unpaired election which can cause the dissociation of $OF_2$ according to the following reaction:

$$OF_2 + NO \rightarrow F + FONO$$

The FONO may then further decompose according to the following reaction:

$$FONO \rightarrow F + NO_2$$

A F free radical is generated by this reaction with NO, and the F free radical can then react with the material to be etched.

Although not specifically discussed with respect to individual systems or methods, it will be understood that etching systems suitable for performing the above embodiments may comprise a computer or other control system. Such a computer or other control system may be operably connected to one or more of the components of the system, and may also be connected to system components not shown, such as pressure systems or other monitoring equipment. It will also be understood that at least some the steps of the various methods discussed herein may be performed by a computer, and that such a computer may utilize a computer-readable medium comprising instructions for performing certain of the steps of the various methods discussed herein.

It will be understood that various combinations of the above embodiments are possible. For example, as noted above, other noble gas fluorides may be used in place of $XeF_2$ in the above embodiments. It is also to be recognized that, depending on the embodiment, the acts or events of any methods described herein can be performed in other sequences, may be added, merged, or left out altogether (e.g., not all acts or events are necessary for the practice of the methods), unless the text specifically and clearly states otherwise.

While the above detailed description has shown, described, and pointed out novel features of the invention as applied to various embodiments, it will be understood that various omissions, substitutions, and changes in the form and details of the device of process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of manufacturing an electronic device, comprising:
   providing a process chamber comprising an electronic device, the electronic device comprising a layer to be etched;
   introducing an etchant into an expansion chamber, the etchant comprising a noble gas fluoride;
   reducing the volume of the expansion chamber after introducing the etchant into the expansion chamber to increase the pressure of the etchant, wherein the volume of the expansion chamber is reduced when the expansion chamber is not in fluid communication with the process chamber; and
   introducing the pressurized etchant into the process chamber to expose the sacrificial layer to the etchant.

2. The method of claim 1, wherein the noble gas fluoride comprises $XeF_2$.

3. The method of claim 1, wherein the etchant remains in the process chamber for a predetermined dwell time, further comprising removing at least a portion of the gases from the process chamber at the conclusion of the dwell time.

4. The method of claim 2, additionally comprising introducing additional etchant into the process chamber after removing at least a portion of the gases from the process chamber.

5. The method of claim 4, additionally comprising introducing said additional etchant into said expansion chamber and compressing said additional etchant prior to removing at least a portion of the gases from the process chamber.

6. The method of claim 1, additionally comprising maintaining the expansion chamber at a higher temperature than the process chamber.

7. The method of claim 1, wherein the electronic device comprises a MEMS device, and wherein the layer to be etched comprises a sacrificial layer.

8. A method of manufacturing an electronic device, comprising:
   providing a process chamber containing an electronic device, the electronic device comprising a layer to be etched;
   introducing an etchant into the process chamber, the etchant comprising a noble gas fluoride, wherein introducing an etchant into the process chamber comprises:
      introducing the etchant into an expansion chamber;
      reducing the volume of the expansion chamber after introducing the etchant into the expansion chamber; and
      placing the expansion chamber into fluid communication with the process chamber after the volume of the expansion chamber is reduced;
   monitoring the partial pressure of the etchant in the process chamber; and
   introducing additional etchant into the process chamber based at least in part on the monitored partial pressure of the etchant in the process chamber.

9. The method of claim 8, additionally comprising monitoring the total pressure of the process chamber.

10. The method of claim 8, wherein introducing additional etchant into the process chamber based upon the monitored partial pressure of the etchant in the process chamber comprises maintaining at least a minimum partial pressure of the etchant in the process chamber over a period of time.

11. The method of claim 8, wherein introducing additional etchant into the process chamber based upon the monitored partial pressure of the etchant in the process chamber comprises periodically introducing additional etchant into the process chamber when the partial pressure of the etchant drops below a desired value.

12. The method of claim 8, additionally comprising removing process gases from the process chamber.

13. The method of claim 12, additionally comprising filtering the process gases to separate a noble gas from the process gases.

14. The method of claim 12, additionally comprising filtering the process gases to separate the noble gas from the process gases.

15. The method of claim 8, wherein the electronic device comprises a MEMS device.

* * * * *